(12) United States Patent
Carlson

(10) Patent No.: US 10,446,572 B2
(45) Date of Patent: Oct. 15, 2019

(54) VOID FORMATION FOR CHARGE TRAP STRUCTURES

(71) Applicant: Micron Technology, Inc., Boise, ID (US)

(72) Inventor: Chris M Carlson, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/675,197

(22) Filed: Aug. 11, 2017

(65) Prior Publication Data

US 2019/0051660 A1  Feb. 14, 2019

(51) Int. Cl.
| | |
|---|---|
| *H01L 21/28* | (2006.01) |
| *H01L 29/423* | (2006.01) |
| *H01L 27/11582* | (2017.01) |
| *H01L 27/1157* | (2017.01) |
| *H01L 29/51* | (2006.01) |

(52) U.S. Cl.
CPC .. *H01L 27/11582* (2013.01); *H01L 21/28282* (2013.01); *H01L 27/1157* (2013.01); *H01L 29/4234* (2013.01); *H01L 29/512* (2013.01)

(58) Field of Classification Search
CPC ......... H01L 51/56; H01L 43/08; H01L 33/62; H01L 43/02; C09K 11/06
USPC ....................................................... 257/217
See application file for complete search history.

(56) References Cited

U.S. PATENT DOCUMENTS

| | | | |
|---|---|---|---|
| 6,674,138 B1 | 1/2004 | Halliyal et al. | |
| 7,052,967 B2 | 5/2006 | Lee et al. | |
| 7,804,120 B2 | 9/2010 | Lee et al. | |
| 7,999,304 B2 | 8/2011 | Ozawa et al. | |
| 8,034,693 B2 | 10/2011 | Shibata et al. | |
| 8,148,789 B2 | 4/2012 | Kito et al. | |
| 9,136,128 B2 | 9/2015 | Lee et al. | |
| 9,177,966 B1 | 11/2015 | Rabkin et al. | |
| 9,343,316 B2 | 5/2016 | Lee et al. | |
| 9,406,694 B1 * | 8/2016 | Ikeno | H01L 27/11582 |
| 9,679,778 B2 | 6/2017 | Lee et al. | |
| 9,679,907 B1 | 6/2017 | Kaneko | |

(Continued)

FOREIGN PATENT DOCUMENTS

| | | |
|---|---|---|
| KR | 101017713 B1 | 2/2011 |
| KR | 20110034816 A | 4/2011 |

(Continued)

OTHER PUBLICATIONS

Daycock, David A, et al., "U.S. Appl. No. 15/422,335, Memory Arrays, and Methods of Forming Memory Arrays, filed Feb. 1, 2017.", 39 pgs.

(Continued)

*Primary Examiner* — Andy Huynh

(74) *Attorney, Agent, or Firm* — Schwegman Lundberg & Woessner, P.A.

(57) ABSTRACT

Various embodiments include methods and apparatus having a number of charge trap structures, where each charge trap structure includes a dielectric barrier between a gate and a blocking dielectric region, the blocking dielectric region located on a charge trap region of the charge trap structure. At least a portion of the gate can be separated by a void from a region which the charge trap structure is directly disposed. Additional apparatus, systems, and methods are disclosed.

22 Claims, 20 Drawing Sheets

(56) References Cited

U.S. PATENT DOCUMENTS

| | | |
|---|---|---|
| 9,748,262 B1 | 8/2017 | Lai et al. |
| 10,134,597 B2 | 11/2018 | Lee et al. |
| 10,164,009 B1 | 12/2018 | Carlson |
| 2002/0008261 A1 | 1/2002 | Nishiyama |
| 2007/0184615 A1 | 8/2007 | Brazzelli et al. |
| 2007/0257305 A1 | 11/2007 | Sasago et al. |
| 2007/0296016 A1 | 12/2007 | Nagano et al. |
| 2008/0012061 A1 | 1/2008 | Ichige et al. |
| 2008/0054341 A1 | 3/2008 | Natori et al. |
| 2008/0197403 A1 | 8/2008 | Ozawa et al. |
| 2008/0246078 A1 | 10/2008 | Huo et al. |
| 2008/0283898 A1 | 11/2008 | Kuniya |
| 2009/0101883 A1 | 4/2009 | Lai et al. |
| 2009/0302367 A1 | 12/2009 | Nagano |
| 2010/0003795 A1 | 1/2010 | Park et al. |
| 2010/0019311 A1 | 1/2010 | Sato et al. |
| 2010/0044772 A1 | 2/2010 | Yonemochi et al. |
| 2010/0078758 A1 | 4/2010 | Sekar et al. |
| 2010/0133525 A1 | 6/2010 | Arai et al. |
| 2010/0176368 A1 | 7/2010 | Ko et al. |
| 2010/0176438 A1 | 7/2010 | Lue et al. |
| 2010/0187593 A1 | 7/2010 | Morikado |
| 2010/0190330 A1 | 7/2010 | Yonemochi et al. |
| 2010/0213537 A1 | 8/2010 | Fukuzumi et al. |
| 2010/0295113 A1 | 11/2010 | Kang et al. |
| 2011/0097887 A1 | 4/2011 | Aoyama et al. |
| 2011/0104883 A1 | 5/2011 | Nagano |
| 2011/0108905 A1 | 5/2011 | Ichige et al. |
| 2011/0193153 A1 | 8/2011 | Higuchi et al. |
| 2011/0298013 A1 | 12/2011 | Hwang et al. |
| 2011/0300703 A1 | 12/2011 | Sato et al. |
| 2011/0303967 A1 | 12/2011 | Harari et al. |
| 2011/0309425 A1 | 12/2011 | Purayath et al. |
| 2011/0309426 A1 | 12/2011 | Purayath et al. |
| 2011/0309430 A1 | 12/2011 | Purayath et al. |
| 2012/0001252 A1 | 1/2012 | Alsmeier et al. |
| 2012/0012920 A1 | 1/2012 | Shin et al. |
| 2012/0049268 A1 | 3/2012 | Chang et al. |
| 2012/0126302 A1 | 5/2012 | Noda et al. |
| 2012/0126303 A1 | 5/2012 | Arai et al. |
| 2012/0213006 A1 | 8/2012 | Isomura et al. |
| 2012/0256247 A1 | 10/2012 | Alsmeier |
| 2012/0280303 A1 | 11/2012 | Kiyotoshi et al. |
| 2012/0319172 A1 | 12/2012 | Ramaswamy et al. |
| 2013/0049093 A1 | 2/2013 | Lee et al. |
| 2013/0056819 A1 | 3/2013 | Matsushita et al. |
| 2013/0134493 A1 | 5/2013 | Eom et al. |
| 2015/0069494 A1 | 3/2015 | Makala et al. |
| 2015/0091078 A1 | 4/2015 | Jang et al. |
| 2015/0137062 A1 | 5/2015 | Ananthan et al. |
| 2015/0243675 A1 | 8/2015 | Lim et al. |
| 2015/0348790 A1 | 12/2015 | Lee et al. |
| 2015/0380431 A1 | 12/2015 | Kanamori et al. |
| 2016/0093636 A1 | 3/2016 | Pang et al. |
| 2016/0254159 A1 | 9/2016 | Lee |
| 2016/0351582 A1 | 12/2016 | Kim et al. |
| 2017/0069637 A1 | 3/2017 | Son et al. |
| 2017/0098659 A1 | 4/2017 | Yoshimizu et al. |
| 2017/0117290 A1 | 4/2017 | Lee et al. |
| 2017/0141122 A1 | 5/2017 | Yoshimizu et al. |
| 2017/0200737 A1 | 7/2017 | Sun et al. |
| 2017/0229474 A1 | 8/2017 | Shimizu et al. |
| 2017/0278851 A1 | 9/2017 | Fujii et al. |
| 2017/0287719 A1 | 10/2017 | Lee et al. |
| 2019/0157092 A1 | 5/2019 | Lee et al. |

FOREIGN PATENT DOCUMENTS

| | | |
|---|---|---|
| KR | 20120007838 U | 11/2012 |
| KR | 20130116607 A | 10/2013 |
| TW | 486773 | 5/2002 |
| TW | 201244007 A | 11/2012 |
| TW | 201705451 A | 2/2017 |
| WO | WO-2019032376 A1 | 2/2019 |

OTHER PUBLICATIONS

Kanarik, Keren J, et al., "Overview of atomic layer etching in the semiconductor industry", J Vac Sci Technol. A, vol. 33 No. 2, (2015), 14 pgs.

Lee, Younghee, et al., "Atomic Layer Etching of Al2O3 Using Sequstial Self-Limiting Thermal Reactions with Sn acac2 and Hydrogen Fluoride", American Chemical Society vol. 9 No. 2, (2015), 2061-2070.

Lee, Younghee, et al., "Atomic Layer Etching of HfO2 Using Sequential, Self-Limiting Thermalo Reactions with Sn acac2 and HF", ECS Journal of Solid Science and Technology 4 (6), (Mar. 12, 2015), 20 pgs.

Tsukamoto, Keisuke, et al., "Advanced Air Gap Process for Multi-Level-Cell Flash Memories Reducing Threshold Voltage Interference and Realizing High Reliability", Jpn. J. Appl. Phys. 46, (2007), 1.

"International Application Serial No. PCT/US2018/044353, International Search Report dated Nov. 14, 2018", 3 pgs.

"International Application Serial No. PCT/US2018/044353, Written Opinion dated Nov. 14, 2018", 6 pgs.

"International Application Serial No. PCT/US2018/044375, International Search Report dated Nov. 16, 2018", 3 pgs.

"International Application Serial No. PCT/US2018/044375, Written Opinion dated Nov. 16, 2018", 14 pgs.

"International Application Serial No. PCT/US2018/044990, International Search Report dated Dec. 7, 2018", 3 pgs.

"International Application Serial No. PCT/US2018/044990, Written Opinion dated Dec. 7, 2018", 9 pgs.

"International Application Serial No. PCT/US2018/045015, International Search Report dated Nov. 23, 2018", 3 pgs.

"International Application Serial No. PCT/US2018/045015, Written Opinion dated Nov. 23, 2018", 10 pgs.

"Taiwanese Application Serial No. 107127913, Office Action dated May 3, 2019", W/O English Translation, 7 pgs.

"Taiwanese Application Serial No. 107127922, First Office Action dated Apr. 19, 2019", W/O English Translation, 19 pgs.

\* cited by examiner

VOID FORMATION FOR CHARGE TRAP STRUCTURES

BACKGROUND

The electronics industry is under constant pressure to both reduce component size as well as power requirements and has a market driven need to improve operation of memory devices. One approach to reduce component size is to fabricate devices in a three-dimensional (3D) configuration. For example, a memory device can be arranged as a stack of memory cells vertically on a substrate. Such memory cells can be implemented as charge trap cells. Improvements to charge trap based memory devices and their operation can be addressed by advances in design and processing of the memory devices.

DETAILED DESCRIPTION

The following detailed description refers to the accompanying drawings that show, by way of illustration, various embodiments of the invention. These embodiments are described in sufficient detail to enable those of ordinary skill in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. The terms "wafer" and "substrate" are used herein to refer generally to any structure on which integrated circuits are formed, and also to such structures during various stages of integrated circuit fabrication. A wafer may include a number of die in which an integrated circuit is disposed with respect to a respective substrate of the die.

Figure 1:
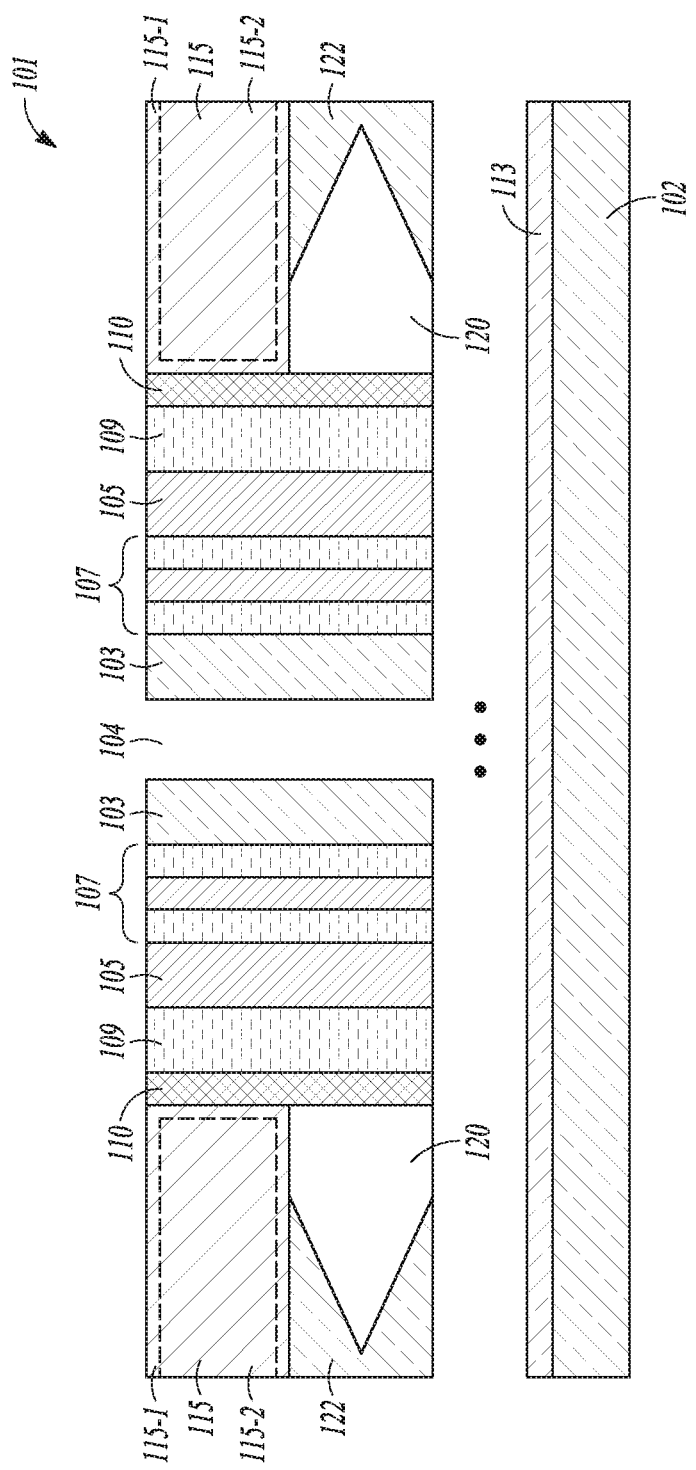
FIG. 1 is a cross-sectional representation of an example charge trap structure, according to various embodiments.

FIG. 1 is a cross-sectional representation of an embodiment of an example charge trap (CT) structure 101, which can be included in a variety of electronic apparatus. Such apparatus can include a memory array, a memory device, an integrated circuit, or other apparatus that includes one or more cells to store charge. The CT structure 101 can include a semiconductor pillar 103, a charge trap region 105, a tunnel region 107, a dielectric blocking region 109, a dielectric barrier 110, and a gate 115. Gate 115 is adjacent to dielectric blocking region 109 to control storage of charge in the charge trap region 105. At least a portion of gate 115 is separated from at least a portion of an adjacent gate by at least a void 120. A void in a structure is a region of the structure without solid material and without liquid material. A void may be in the form of an evacuated region, an air gap, a gas-filled region, or similar construction. An air gap in a structure or between structures is a gap or region that is filled with air. Herein, the term air gap may include ambient gases enclosed in the gap, such as during formation of the gap. A void may be structured between at least a portion of gate 115 and at least a portion of a region above which charge trap structure 101 is directly disposed.

In various embodiments, the arrangement of CT structure 101 with conductive region 113 can have a different structural arrangement. CT structure 101 can be separated from conductive region 113 by an access transistor that can be a transistor structure different from a CT that can operatively act as a transmission gate to provide operational coupling of conductive region 113 to CT structure 101. In such an alternative structure, semiconductor pillar 103 of CT 101 may be coupled to and integrated in the access transistor such that coupling of semiconductor pillar 103 with conductive region 113 is made by a channel of the access transistor. In addition, a void 120 could also be utilized to at least partially separate a gate 115 from the access transistor structure. In other embodiments, the region on which charge trap structure 101 is directly disposed can be another charge trap structure, in which a void 120 could be used to at least partially separate a gate 115 of charge trap structure 101 from a gate of the charge trap structure on which charge trap structure 101 is directly disposed.

Charge trap structure 101 can be disposed above conductive region 113 that is located a substrate 102. An isolation region or other integrated circuit structures can separate components of the charge trap structure 101 from conductive region 113. Alternatively, the CT structure 101 can be disposed on conductive region 113, without a separation or coupling region, with gate 115 separated from conductive region 113 by a void 120 and a sealing dielectric 122. As noted above, CT structure 101 can be disposed above conductive region 113 with gate 115 separated from an access transistor, which couples CT structure 101 to conductive region 113, by a void 120 and a sealing dielectric 122.

Sealing dielectric 122 is a region for CT structure 101 used to seal off a void 120 during processing of different areas of the electronic apparatus in which CT structure 101 is integrated, where portions of sealing dielectric 122 remain in the completed structure, continuing to seal the void 120. Void 120 can be contained within a region bounded by at least a portion of dielectric barrier 110, at least a portion of conductive region 113 and/or at least a portion of a region on which CT structure 101 is directly disposed, at least a portion of gate 115, and at least a portion of sealing dielectric 122, where sealing dielectric 122 is disposed on portions of gate 115. Alternatively, sealing dielectric 122 can be disposed along the entire surface of gate 115, which may reduce the size of void 120. The figures herein are not drawn to scale. Further, electrical connections of gate 115, semiconductor pillar 103, and conductive region 113 to other components of an apparatus, in which CT structure 101 is integrated, are not shown to focus on the CT structure 101.

Semiconductor pillar 103 is operable to conduct a current and gate 115 is operable to control storage of charge in the charge storage region. Gate 115 can be a metal gate. Gate 115 can include combinations of metal and metallic compound. Gate 115 is conductive and can include, but is not limited to, conductive titanium nitride and/or tungsten. For example, gate 115 include a conductive titanium nitride region 115-1 on which a tungsten region 115-2 is disposed. Gate 115 can be referred to as a control gate and dielectric blocking region 109 can be referred to as a control dielectric.

Semiconductor pillar 103 can include, but is not limited to, polycrystalline silicon (poly silicon). The semiconductor material of semiconductor pillar 103 may have a majority carrier concentration that is less than the majority carrier concentration of conductive region 113, with conductive region 113 structured as a semiconductor region. The difference in majority carrier concentration can be orders of magnitude in powers of base 10. The regions of structure 101 shown in FIG. 1 can be arranged as rings of material around center region 104. Center region 104 can be a dielectric. Center region 104 can be a region of dielectric material, such as, but not limited to, a dielectric oxide. An example of a dielectric oxide in center region 104 can include silicon oxide.

Charge trap region 105 is separated from the semiconductor pillar 103 by a tunnel region 107. Charge trap region 105 can be a dielectric material that can store charge from semiconductor pillar 103. Charge trap region 105 can be a dielectric nitride region such as a region including dielectric silicon nitride. Other dielectric materials for charge trap region 105 can be used to trap charge. Tunnel region 107 can be constructed as an engineered region to meet a selected criterion, such as, for example but not limited to, an equivalent oxide thickness (EOT). The EOT quantifies the electrical properties of tunnel region 107, such as capacitance, of a dielectric in terms of a representative physical thickness. For example, EOT can be defined as the thickness of a theoretical $SiO_2$ layer that would be required to have the same capacitance density as a given dielectric (tunneling region 107), ignoring leakage current and reliability considerations. Tunnel region can include an oxide and a nitride. Tunnel region 107 may include a set of dielectric barriers. The example in FIG. 1 shows tunnel region 107 being a three region tunnel barrier. The three region tunnel barrier can be arranged as a region of dielectric oxide followed by a region of dielectric nitride followed by another region of dielectric oxide. Alternatively, tunnel region 107 can be a two region tunnel barrier or a one region tunnel barrier. Further, tunnel region 107 may have four or more regions, where the selection of material and thicknesses depends on the capability of the material with the given thicknesses to perform as a tunneling region to charge trap region 105.

Dielectric blocking region 109 is disposed on and contacting the charge trap region 105. Dielectric blocking region 109 provides a mechanism to block charge from flowing from charge trap region 105 to gate 115. Dielectric blocking region 109 can be an oxide or other dielectric such as used in tunnel region 107. Gate 115 is disposed adjacent to dielectric blocking region 109, but separate from dielectric blocking region 109 by dielectric barrier 110 that is between dielectric blocking region 109 and gate 115, where the material of dielectric barrier 110 is different from the material of dielectric blocking region 109.

Dielectric barrier 110, structured as a thin region, between dielectric blocking region 109 and gate 115 enables an enhanced tunneling barrier that prevents back-tunneling of electrons from gate 115 through dielectric blocking region 109 into charge trap region 105, which can thereby limit operational erase saturation to small positive or small negative threshold voltage ($V_t$) levels. Dielectric barrier 110 can have a thickness in the range from about 15 angstroms to about 50 angstroms between dielectric blocking region 109 and gate 115. Selection of material for dielectric barrier 110 can be based on the fabrication of CT structure 101. For example, in a process in which CT structure 101 including void 120 is formed by removing of material from areas to the sides of CT structure 101, the material for dielectric barrier 110 can be selected such that the material for dielectric barrier 110 resists removal at the processing chemistries and temperatures used in removal of these materials from the sides of CT structure 101. The material for dielectric barrier 110 can act as a mask to prevent removal of dielectric blocking region 109 in such removal processes.

Dielectric barrier 110 can be realized as an $AlO_x$ region or a dielectric region having a higher dielectric constant, κ, than $AlO_x$. (Use of nomenclature $AB_x$ indicates an AB material that is not limited to a particular stoichiometry for the AB compound.) The dielectric barrier 110 can have an electron affinity lower than that aluminum oxide. Dielectric barrier 110 can include one or more of aluminum oxide, hafnium oxide, zirconium oxide, or mixtures of hafnium oxide and/or zirconium oxide with one or more of aluminum oxide, silicon oxide, titanium oxide, gadolinium oxide, niobium oxide, or tantalum oxide. Examples of films that can be used include $HfO_2$ and/or $ZrO_2$ based materials, as well as mixtures with other materials such as $AlO_x$, $SiO_2$, $TiO_2$, $GaO_x$, $NbO_x$, and $Ta_2O_5$. Such materials may not be limited to a particular stoichiometry.

In various embodiments, a memory device can be structured as a memory structure in which memory cells to store charge are arranged in different levels in a 3D structure. For example, the memory device can include a 3D NAND stack in which memory cells similar to CT structure 101 can be arranged. A NAND array architecture can be arranged as an array of memories (e.g., memory cells) arranged such that the memories of the array are coupled in logical rows to access lines. The access lines may be word lines. Memories of the array can be coupled together in series between common regions, such as source lines, and data lines. The data lines may be bit lines.

The 3D NAND stack can be implemented with a dielectric barrier, such as dielectric barrier 110, using materials for the dielectric barrier selected to enable processing of voids between CT structures arranged in the 3D NAND stack. Within CT cells in the 3D NAND stack, the gate of each such CT cell, which may be coupled to an access line, for example a word line, or formed as part of the access line, can be formed in a process in which an initially formed region, having material such as silicon nitride, is removed and replaced by a conductive gate in a number of CT cells in a vertical string in the stack. Such gates may be referred to as replacement gates.

Figure 2:
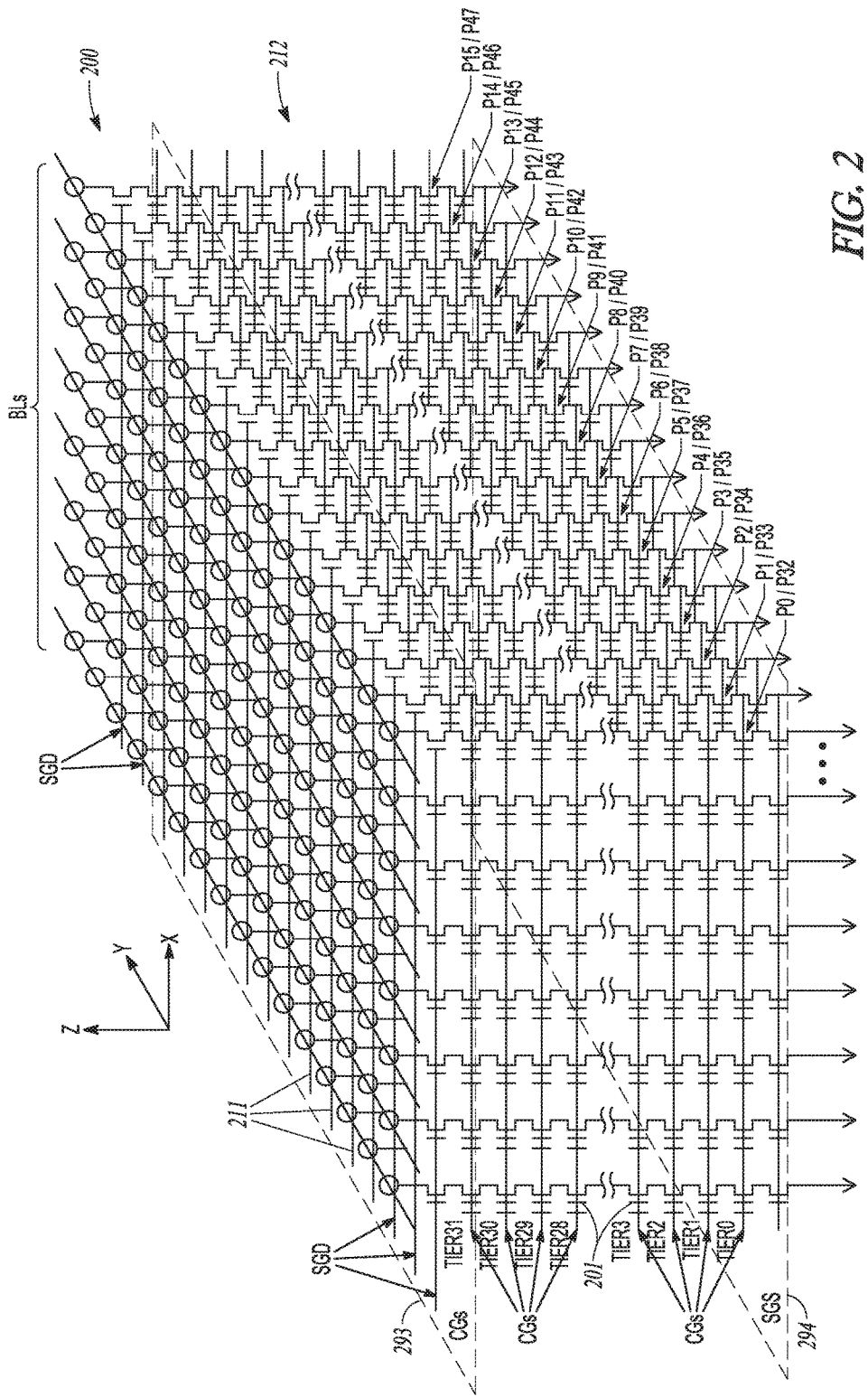
FIG. 2 is a schematic diagram of an example of a block architecture and page address mapping of a memory array of a three-dimensional memory device, according to various embodiments.

FIG. 2 is a schematic diagram of an embodiment of an example of a block architecture and page address mapping of a memory array 212 of a 3D memory device 200. Memory device 200 can be realized in the form of a 3D NAND memory device 200. Memory device 200 can comprise multiple vertical strings 211 of charge storage devices 201. In the Z direction shown in FIG. 2, each string 211 of charge storage devices can comprise multiple storage devices 201 stacked over one another with each charge storage device 201 corresponding to one of multiple tiers. For example, as shown in FIG. 2, thirty-two charge storage devices are stacked over one another in a string with each charge storage device 201 corresponding to one of thirty-two tiers shown as Tier0-Tier31. The number of storage devices and tiers in the Z direction are not limited to thirty-two. The charge storage devices 201 of a respective string 211 may share a common channel region, such as one formed in a respective pillar of semiconductor material (e.g., polysilicon) about which the string of charge storage devices are formed. The pillars may be polysilicon, monocrystalline silicon, or other semiconductor structure in which transistors can be fabricated.

In the X direction shown in FIG. 2, sixteen groups of strings may comprise eight strings that share thirty two access lines, CGs. Each of the access lines CGs may couple (e.g., electrically or otherwise operatively connect) the charge storage devices 201 corresponding to a respective tier of each string 211 of a corresponding one of the eight strings. The charge storage devices 201 coupled by the same access line, CG, (and thus corresponding to the same tier) may be logically grouped into, for example, two pages, such as P0/P32, P1/P33, P2/P34 and so on, when each charge storage device comprise a multi-level cell capable of storing multiple bits of information. Memory device 200 can be arranged to operate each charge storage device as a quad level cell. The page address mapping counts up horizontally in the same tier.

In the Y direction shown in FIG. 2, eight groups of strings can comprise sixteen strings coupled to a corresponding one of eight data lines (BLs). The structure with respect to the SGSs in this example is one plate 294, which connects 16 pillar strings together, and the structure with respect to the CGs is one plate 293, which connects 16 pillar strings together. The SGD is separated by one pillar string. The number of the strings, tiers, access lines, data lines, groups of strings in each direction, and/or pages may be greater or smaller than those shown in FIG. 2.

The vertical strings 211 can include a vertical pillar of semiconductor material with a number of charge storage devices 201 arranged along each vertical string. Each charge storage device 201 can include a charge trap region separated from the vertical pillar of a respective vertical string by a tunnel region; a dielectric blocking region on the charge trap region: a gate adjacent to the dielectric blocking region to control storage of charge in the charge storage region, the gate coupled to an access line; and a dielectric barrier between the dielectric blocking region and the gate, where there is a void between at least portions of the gate and at least portions of a gate of an adjacent charge storage device 201. The gate of each charge storage device 201 can be coupled to (e.g., integrated with) an access line CG corresponding to the location in memory array 212 of the respective charge storage device 201. Charge storage device 201 may be realized in a manner similar to the CT structure of FIG. 1.

The components of charge storage device 201 can be implemented by selecting properties from a number of different parameters. The dielectric barrier of charge storage device 201 can include one or more of aluminum oxide, hafnium oxide, zirconium oxide, and mixtures of hafnium oxide and/or zirconium oxide with one or more of aluminum oxide, silicon oxide, titanium oxide, gadolinium oxide, niobium oxide, or tantalum oxide. The dielectric barrier can have a thickness in a range from about 15 angstroms to about 50 angstroms from the dielectric blocking region to the gate of charge storage device 201.

The tunnel region of charge storage device 201 can be implemented as a three region tunnel barrier. Such a three region tunnel barrier can be implemented as a region of dielectric oxide followed by a region of dielectric nitride followed by another region of dielectric oxide. The tunnel region of charge storage device 201 can be implemented as a multiple region barrier other than three regions. Such a multiple region barrier can be implemented such that the selection of material and thicknesses of the regions depends on the capability of the material with the given thicknesses to perform a tunneling region to the charge trap region of charge storage device 201. The gate of charge storage device 201 can be implemented as a metal gate or a gate including a combination of metal and metallic compounds. The channel of charge storage device 201 in a string 211 can be implemented as a poly silicon channel.

Figure 3:
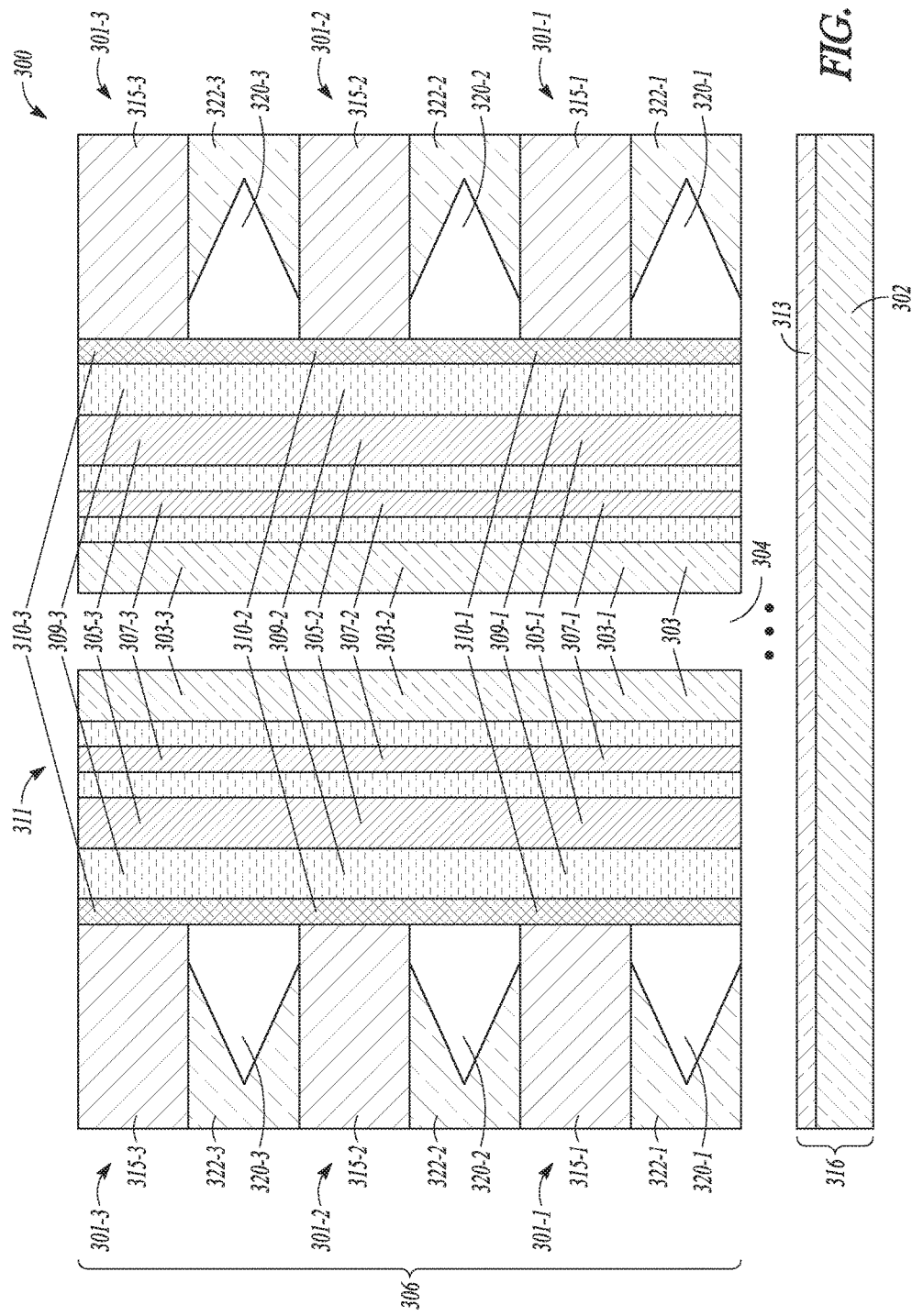
FIG. 3 is a cross-sectional representation of an example of a number of charge trap structures in a vertical string of a memory device, according to various embodiments.

FIG. 3 is a cross-sectional representation of an embodiment of a number of CT structures, for example CT structures 301-1, 301-2, and 301-3, in a vertical string 311 of a memory device 300. Vertical string 311 can be one of multiple strings of a memory array of a 3D memory. An example of a 3D memory device with multiple vertical strings is shown in FIG. 2. Other 3D memory devices with multiple vertical strings can be structured with CT memory cells, similar to the CT structures of 301. Other vertical strings in a 3D memory device can be structured similar to vertical string 311, arranged with different sets of electrical connections.

Vertical string 311 includes a vertical pillar 303 of semiconductor material coupled to and part of CT structures 301-1, 301-2, and 301-3. Memory device 300 is not limited to three CT structures in a vertical string. FIG. 3 shows three CT structures to focus on the architecture of CT structures arranged in a vertical stack 306 along or as part of vertical string 311. Vertical string 311 can be include more than three CT structures, for example, 8, 16, 32, 64, or other number of CT structures coupled to vertical pillar 303 of vertical string 311 depending on the memory size of memory device 300 or other factors for an architecture for memory device 300. Each CT structure can be arranged as a memory cell of a string, where each CT structure is at a different vertical level than the other CT structures of the string, which each vertical level is a tier of the memory array of the memory device.

Stack 306 can be supported by a base 316. In FIG. 3, a space is shown between the bottom of stack 306 and base 316 to indicate that there may be additional materials and/or integrated circuit structures between base 316 and stack 306. In various applications, such additional integrated materials may include, for example, source-side select transistor material. Base 316 may include a conductive region 313 on a substrate 302. Depending on the architecture of memory 300, conductive region 313 may be a source region. Conductive region 313 may include semiconductor material. The semiconductor material may include, but is not limited to, monocrystalline silicon or polycrystalline silicon. Substrate 302 may be a semiconductor substrate or a substrate having a combination of semiconductor material and insulating material.

CT structure 301-1 is arranged as a first charge trap structure along vertical string 311, above which charge trap structures 301-2 and 301-3 are arranged in vertical stack 306 with each of charge trap structures 301-2 and 301-3 disposed above another CT structure of vertical stack 306. The semiconductor material of vertical pillar 103 is arranged as a channel 303-1, 303-2, and 303-3 for CT structures 301-1, 301-2, and 301-3, respectively. Each of CT structures 301-1, 301-2, and 301-3 includes a tunnel region 307-1, 307-2, and 307-3, respectively, adjacent and contacting their respective channels 303-1, 303-2, and 303-3. Each of tunnel regions 307-1, 307-2, and 307-3 can be implemented as a set of barriers. For example, each of tunnel regions 307-1, 307-2, and 307-3 can be implemented as a three region tunnel barrier. Such a three region tunnel barrier can be implemented as a region of dielectric oxide followed by a region of dielectric nitride followed by another region of dielectric oxide. Each of tunnel regions 307-1, 307-2, and 307-3 may be implemented as a two region tunnel barrier. Each of tunnel regions 307-1, 307-2, and 307-3 may be implemented as a one region tunnel barrier. Further, each of tunnel regions 307-1, 307-2, and 307-3 may have four or more regions, where the selection of material and thicknesses of these tunnel regions depends on the capability of the material with the given thicknesses to perform as a tunneling region.

Each of CT structures 301-1, 301-2, and 301-3 includes a charge trap region 305-1, 305-2, and 305-3, respectively, adjacent and contacting their respective tunnel regions 307-1, 307-2, and 307-3. Each of charge trap regions 315-1, 315-2, and 315-3 can be a dielectric material that can store charge from channels 303-1, 303-2, and 303-3, respectively. Charge trap regions 315-1, 315-2, and 315-3 can be a dielectric nitride region such as a region including dielectric silicon nitride. Other dielectric materials for charge trap regions 315-1, 315-2, and 315-3 can be used to trap charge. Each of CT structures 301-1, 301-2, and 301-3 includes a dielectric blocking region 309-1, 309-2, and 309-3, respectively, adjacent and contacting their respective charge trap region 305-1, 305-2, and 305-3.

Each of CT structures 301-1, 301-2, and 301-3 can include a dielectric barrier 310-1, 310-2, and 310-3 and a gate 315-1, 315-2, and 315-3, respectively, where each dielectric barrier 310-1, 310-2, and 310-3 is disposed between dielectric blocking region 309-1, 309-2, and 309-3 and gates 315-1, 315-2, and 315-3 of their respective CT structures 301-1, 301-2, and 301-3. Each of dielectric barriers 310-1, 310-2, and 310-3 can be implemented using materials for the dielectric barriers selected to enable processing of voids between CT structures 301-1, 301-2, and 301-3 arranged in the 3D stack 306 associated with string 311. 3D stack 306 can be realized as a 3D NAND stack 306. Each of dielectric barriers 310-1, 310-2, and 310-3 can include an aluminum oxide or a dielectric having a dielectric constant greater than that of aluminum oxide.

Each dielectric barrier 310-1, 310-2, and 310-3 can extend to the dielectric barrier of an adjacent CT structure and can be arranged with gate 315-1, 315-2, and 315-3 of its respective CT structure 301-1, 301-2, and 301-3 and the gate of the adjacent charge trap structure, providing a void between the charge trap structure and the adjacent charge trap structure. Dielectric barrier 310-3 of CT structure 301-3 can extend to dielectric barrier 310-2 of CT structure 301-2 and is arranged with gate 315-3 of CT structure 301-3 and gate 315-2 of adjacent CT structure 301-2 such that void 320-3 is provided. Dielectric barrier 310-2 of CT structure 301-2 can extend to dielectric barrier 310-1 of CT structure 301-1 and is arranged with gate 315-2 of CT structure 301-2 and gate 315-1 of adjacent CT structure 301-1 such that void 320-2 is provided. Each CT structure 301-1, 301-2, and 301-3 is arranged with an adjacent CT structure, vertically up or vertically down in stack 306 associated with vertical string 311. In addition, dielectric barrier 310-1 of CT structure 301-1 can extend to a region on which stack 306 is directly disposed. The region on which stack 306 is directly disposed may be an isolation region or another active device area such as an access transistor that couples stack 306 to conductive region 313 on substrate 302. Dielectric barrier 310-1 of CT structure 301-1 can be arranged with gate 315-1 of CT structure 301-1 and the region on which stack 306 is directly disposed such that void 320-1 is provided. Alternatively, string 311 can be structured with electrical isolation between gate 315-1 and conductive region 313 being provided at least in part by void 320-1.

Each of voids 320-1, 320-2, and 320-3 can be sealed by a dielectric region 322-1, 322-2, and 322-3, respectively. Dielectric region 322-1 can be located on the region on which stack 306 is disposed (alternatively conductive region 313) and can extend to and be located on at least a portion of gate 315-1 of CT 301-1. Void 320-1 can be contained within at least a portion of dielectric barrier 310-1 extended to at least a portion of the region on which stack 306 is directly disposed (alternatively conductive region 313), at least a portion of gate 315-1, at least a portion of dielectric region 322-1 on at least a portion of gate 315-1, at least a portion of the region on which stack 306 is directly disposed (alternatively conductive region 313), and at least a portion of dielectric region 322-1 on at least a portion of the region on which stack 306 is directly disposed (alternatively conductive region 313).

Dielectric region 322-2 can be located on gate 315-2 of CT structure 301-2 and can extend to and be located on gate 315-1 of CT 301-1. Void 320-2 can be contained within at least a portion of dielectric barrier 310-2 extended to dielectric barrier 310-1, at least a portion of gate 315-2, at least a portion of dielectric region 322-2 on gate 315-2 of CT structure 301-2, at least a portion of gate 315-1 of adjacent CT structure 301-1, and at least a portion of dielectric region 322-2 on at least a portion of gate 315-1 of CT structure 301-1.

Dielectric region 322-3 can be located on gate 315-3 of CT 301-3 and can extend to and be located on gate 315-2 of CT structure 301-2. Void 320-3 can be contained within at least a portion of dielectric barrier 310-3 extended to dielectric barrier 310-2, at least a portion of gate 315-3, at least a portion of dielectric region 322-3 on at least a portion of gate 315-3 of CT structure 301-3, at least a portion of gate 315-2 of adjacent CT structure 301-2, and at least a portion of dielectric region 322-3 on at least a portion of gate 315-2 of CT structure 301-2.

In some variations, dielectric regions 322-1, 322-2, and 322-3 may extend along the surfaces of the gates between which they are respectively located to the dielectric barrier extending between adjacent CT structures that are separated by the respective dielectric regions 322-1, 322-2, and 322-3. In such variations, each associated void is contained within a dielectric barrier, a dielectric region on the gate of a charge trap structure, and a dielectric region on the gate of an adjacent charge trap structure. Such voids may be smaller than those in which the sealing dielectrics do not extend to their associated dielectric barriers. The voids between gates of adjacent CT structures can be largest in vertical extent at the dielectric barriers between the adjacent CT structures.

Tunnel region 307-1 of first CT structure 301-1 can extend along vertical pillar 303 of semiconductor material associated with string 311 and can extend through the other CT structures 301-2 and 301-3 as tunnel regions 307-2 and 307-3 of each respective CT structure 301-2 and 301-3. Charge trap region 305-1 of first CT structure 301-1 can extend along vertical pillar 303 of semiconductor material associated with string 311 and can extend through the other CT structures 301-2 and 301-3 as charge trap regions 305-2 and 305-3 of each respective CT structure 301-2 and 301-3. Dielectric blocking region 309-1 of first CT structure 301-1 can extend along vertical pillar 303 of semiconductor material associated with string 311 and can extend through the other CT structures 301-2 and 301-3 as dielectric blocking region 309-2 and 309-3 of each respective CT structure 301-2 and 301-3.

Vertical pillar 103 of string 311 of memory device 300 can be structured as a doped semiconductor hollow channel. By hollow channel is meant that the region in the center of the 3-D channel can be filled by a material different than the material of the channel. Vertical pillar 103 can include poly silicon as a hollow channel surrounding a dielectric 304. Vertical pillar 103 can operatively conduct a current between conductive region 313 and a conductive data line coupled to vertical pillar 103. Such conductive data line may be coupled to vertical pillar 103 by an access transistor. In various 3D memory architectures, such arrangement of conductive region 313 and a conductive data line coupled to vertical pillar 103 can be provided with conductive region 313 being a source region and conductive data line being a data line. The current can be affected by the charge stored in CT structures 301-1, 301-2, and 301-3 along string 311, where control of storing the charge is by the gates 315-1, 315-2, and 315-3 of CT structures 301-1, 301-2, and 301-3. Gates 315-1, 315-2, and 315-3 can be incorporated in access lines of a memory array of memory device 300. The access lines may be word lines.

Voids 320-1, 320-2, and 320-3 between CT structure 301-1 and the region on which stack 306 is disposed (alternatively conductive region 313), between CT structures 301-2 and 301-1, and between CT structures 301-3 and 301-2 provide voids between access lines of a memory array of memory device 300. These voids between access lines can decrease access line (gate) to access line (gate) capacitance relative to using conventional dielectric materials between access lines of a 3D memory device. Using voids, such as voids 320-1, 320-2, and 320-3, for an acceptable capacitance, can allow the distance between access lines (gates) to CT cells to be smaller, allowing more room for the access lines (gates) to CT cells, that is, access lines (gates) can be vertically wider, which can lower the access line resistance.

Figure 4:
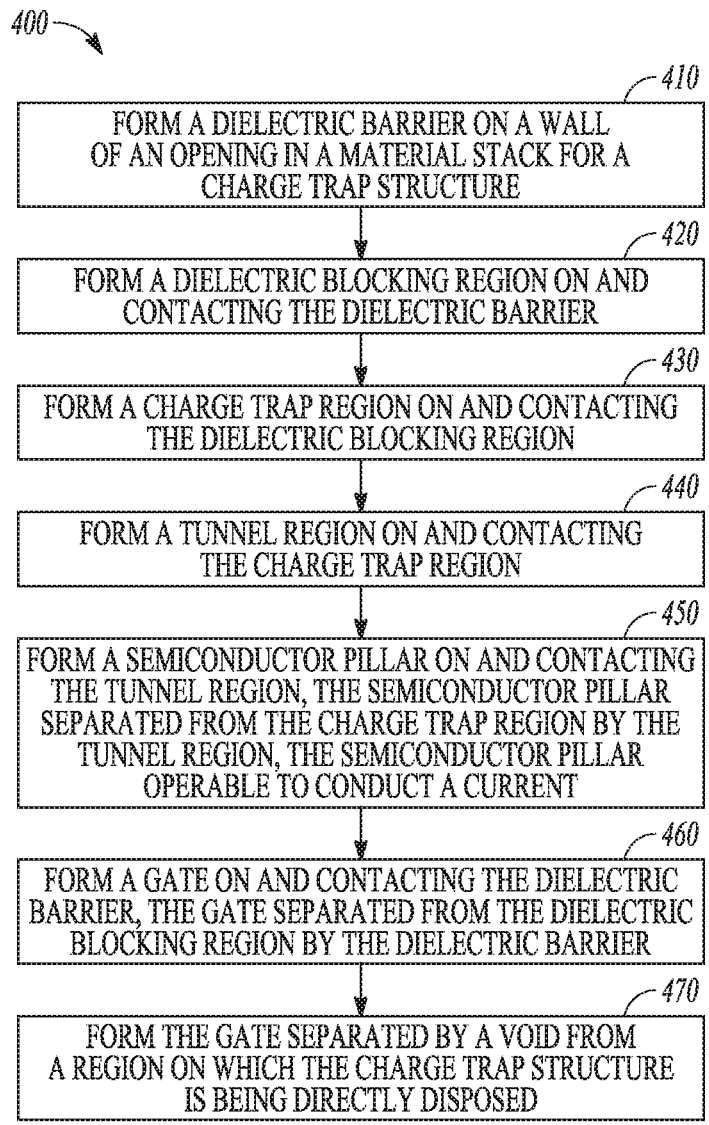
FIG. 4 is a flow diagram of features of an example method of forming a charge trap structure above a conduction region, according to various embodiments.

FIG. 4 is a flow diagram of features of an embodiment of an example method 400 of forming a charge trap structure above a conduction region. At 410, a dielectric barrier is formed on a wall of an opening in a material stack. Forming the dielectric barrier can include forming aluminum oxide or a dielectric having a dielectric constant greater than that of aluminum oxide. Other dielectrics may be used. Forming the dielectric barrier can include forming the dielectric barrier with material that can withstand temperatures and etching chemistries in processing the charge trap structure to mask the dielectric blocking region from being etched during these processes.

At 420, a dielectric blocking region is formed on and contacting the dielectric barrier. The material of the dielectric blocking region is different from the material of the dielectric barrier. At 430, a charge trap region is formed on and contacting the dielectric blocking region. Forming the charge trap region can include forming a dielectric nitride as the charge trap region. Other charge trapping material may be used. At 440, a tunnel region is formed on and contacting the charge trap region. The tunnel region may be formed as a set of regions that can provide for transfer of transfer to the charge trap region. At 450, a semiconductor pillar is formed on and contacting the tunnel region, the channel operable to conduct a current. The semiconductor pillar is separated from the charge trap region by the tunnel region.

At 460, a gate is formed on and contacting the dielectric barrier, the gate separated from the dielectric blocking region by the dielectric barrier. The gate is operable to control storage of charge in the charge trap region. Forming the gate can include forming tungsten as the gate. Forming the gate can include forming a titanium nitride region on and contacting the dielectric barrier and forming the tungsten on the titanium nitride region. At 470, forming the gate can include the gate formed separated by a void from at least a portion of a region on which the charge trap structure is being directly disposed. Forming the gate can include forming a portion of the gate separated from at least a portion of an adjacent gate by at least a void. The dielectric barrier may be arranged with the gate such that the void is between the at least a portion of the gate and the at least a portion of the region on which the charge trap structure is being directly disposed.

Methods similar or identical to method 400 can include forming the opening in the material stack with the material stack having alternating sacrificial regions and isolation dielectrics. The sacrificial regions adjacent to the dielectric barrier can be removed using a chemistry and process to remove the sacrificial region substantially without removing material for the dielectric barrier. The gate can be formed in a region in which a sacrificial region has been removed and the adjacent gate can be formed in a region in which another one of the sacrificial regions has been removed. Material from between the gate and the adjacent gate can be removed to form an open area by a chemistry and process to remove the isolation dielectrics previously formed between adjacent sacrificial regions without substantially removing the material for the dielectric barriers, without substantially removing material of the gate, and without substantially removing material of the adjacent gate. A dielectric can be formed in at least a portion of the open area to form the void.

For a single charge trap structure above a location along a substrate, the region on which the charge trap structure is being directly disposed may be the conductive region. For multiple charge trap structures being formed in a stack above a location along a substrate, the region on which a charge trap structure is being directly disposed may include a gate of an adjacent charge trap structure, the gate being conductive material. The dielectric barrier can be extended to at least a portion of the region on which the charge trap structure is being directly disposed to form the void between at least a portion of the gate and the at least a portion of the region on which the charge trap structure is being directly disposed, with the dielectric barrier separating the void from the dielectric blocking region. A dielectric can be formed to seal the void.

Figure 5:
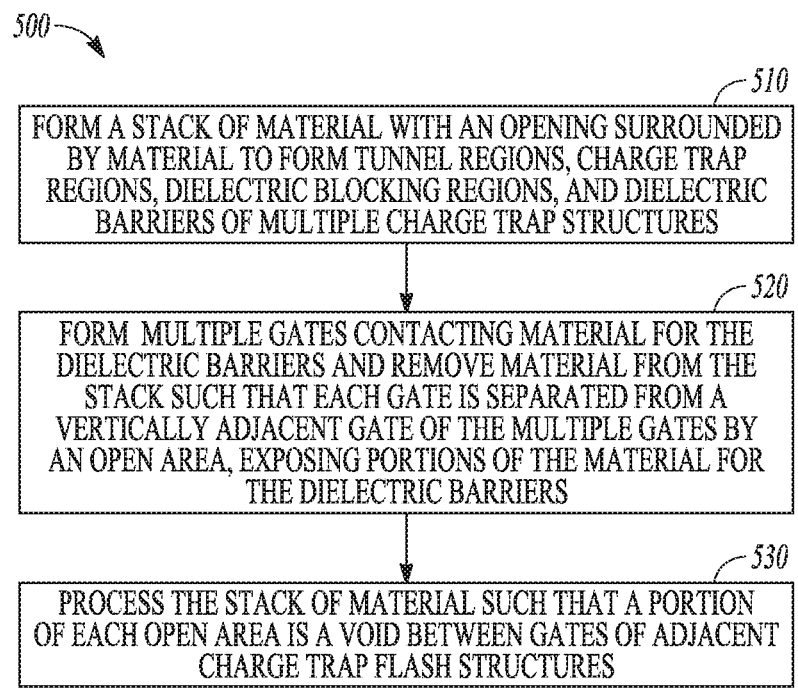
FIG. 5 is a flow diagram of features of an example method of forming multiple charge trap structures in a stack separated by voids, according to various embodiments.

FIG. 5 is a flow diagram of features of an embodiment of an example method 500 of forming multiple charge trap structures with each charge trap structure separated from an adjacent charge trap structure by a void. At 510, a stack of material is formed with an opening surrounded by material to form tunnel regions, charge trap regions, dielectric blocking regions, and dielectric barriers of multiple charge trap structures. The multiple charge trap structures, including a first charge trap structure, is formed with each trap structure, after the first charge trap structure, disposed above another one of the multiple charge trap structures. The material for the dielectric barriers can include aluminum oxide or a dielectric having a dielectric constant greater than that of aluminum oxide.

At 520, multiple gates are formed contacting material for the dielectric barriers and material from the stack is removed such that each gate is separated from a vertically adjacent gate of the multiple gates by an open area, exposing portions of the material for the dielectric barriers. Forming multiple gates contacting material for the dielectric barriers and removing material such that each gate is separated from a vertically adjacent gate of the multiple gates can include, with the stack of material including alternating sacrificial regions and isolation dielectrics adjacent to the material to form tunnel regions, charge trap regions, dielectric blocking regions, and dielectric barriers: removing sacrificial regions adjacent to the material for the dielectric barriers using a chemistry and process to remove the sacrificial region substantially without removing material for the dielectric barrier; forming gate material in each region in which a sacrificial region is removed; and removing material from between each gate by a chemistry and process to remove the isolation dielectrics previously formed between adjacent sacrificial regions without substantially removing the material for the dielectric barriers and without substantially removing the gate material in each region. Forming the gate material in each region in which the sacrificial region is removed can include forming the gate material coupled to access lines in a memory array for a memory device.

At 530, the stack of material is processed further such that a portion of each open area is a void between gates of adjacent charge trap structures. Method 500 or methods similar to method 500 can include sealing, with a dielectric, the open area between gates of adjacent charge trap structures in forming the void.

In various embodiments, methods including forming CT structure with associated voids can be performed using variations of methods similar to method 400 and/or method 500. Note that these features may be performed in a number of different sequencing steps and are not limited to the order or features as presented in FIGS. 4 and 5.

Figure 6A:
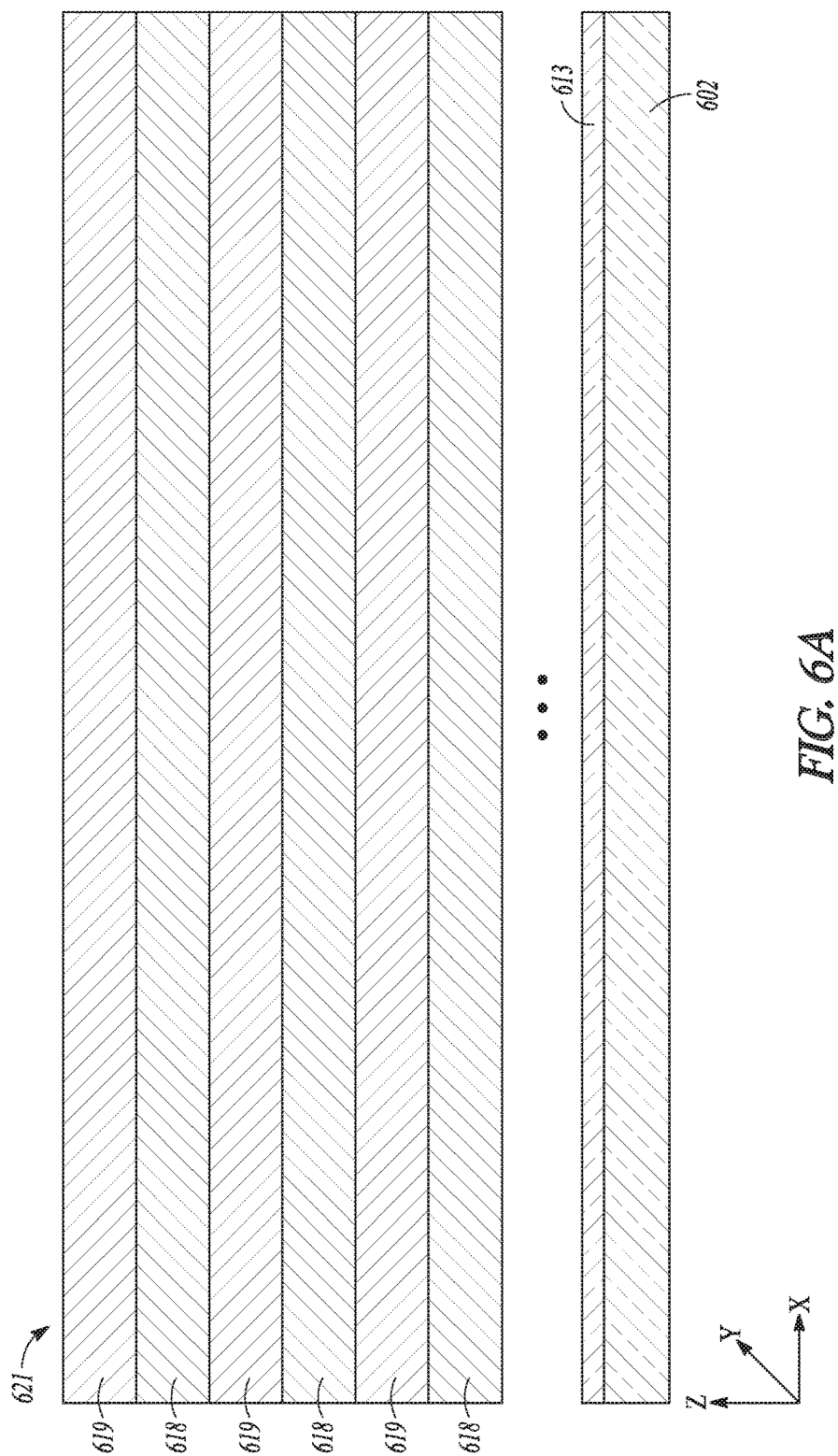
FIGS. 6A-6N are cross-sectional views illustrating stages of an example method of forming charge trap structures, according to various embodiments.
Figure 6B:
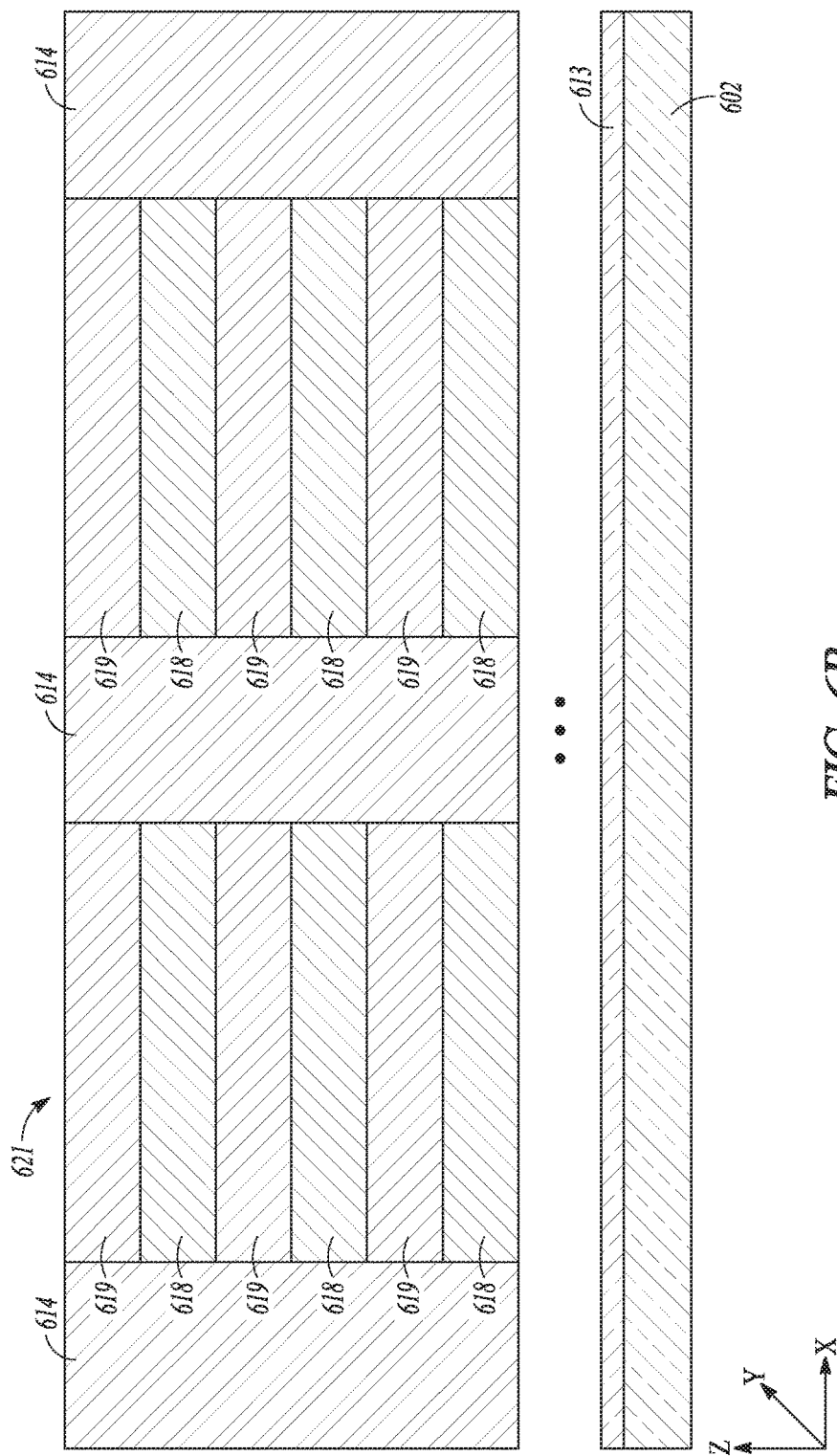
Figure 6C:
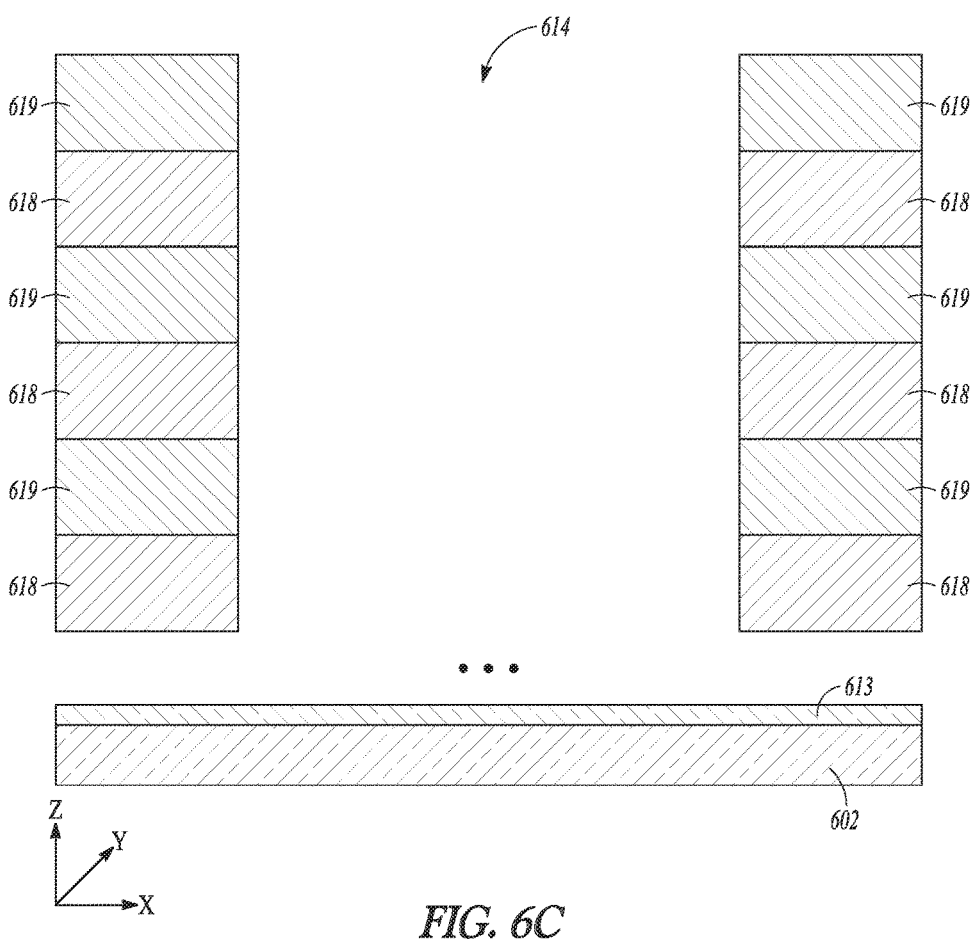
Figure 6D:
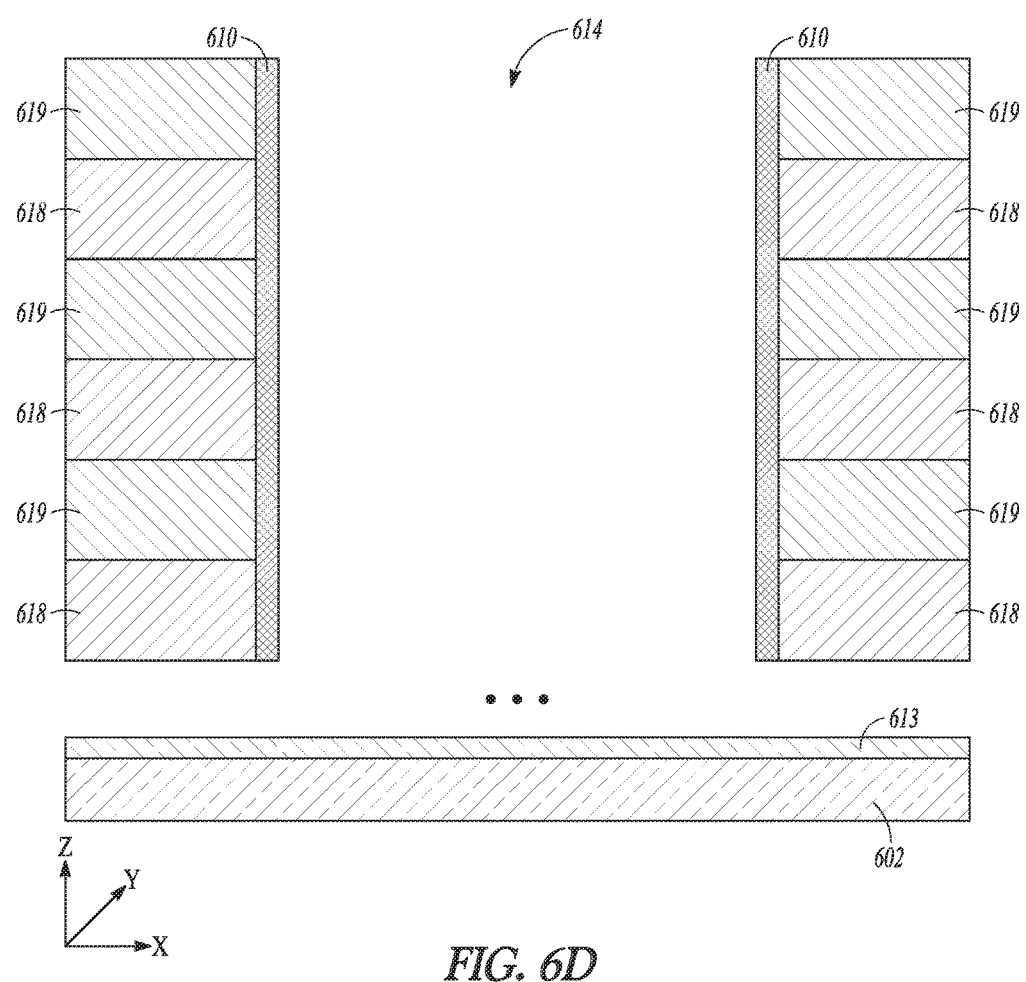
Figure 6E:
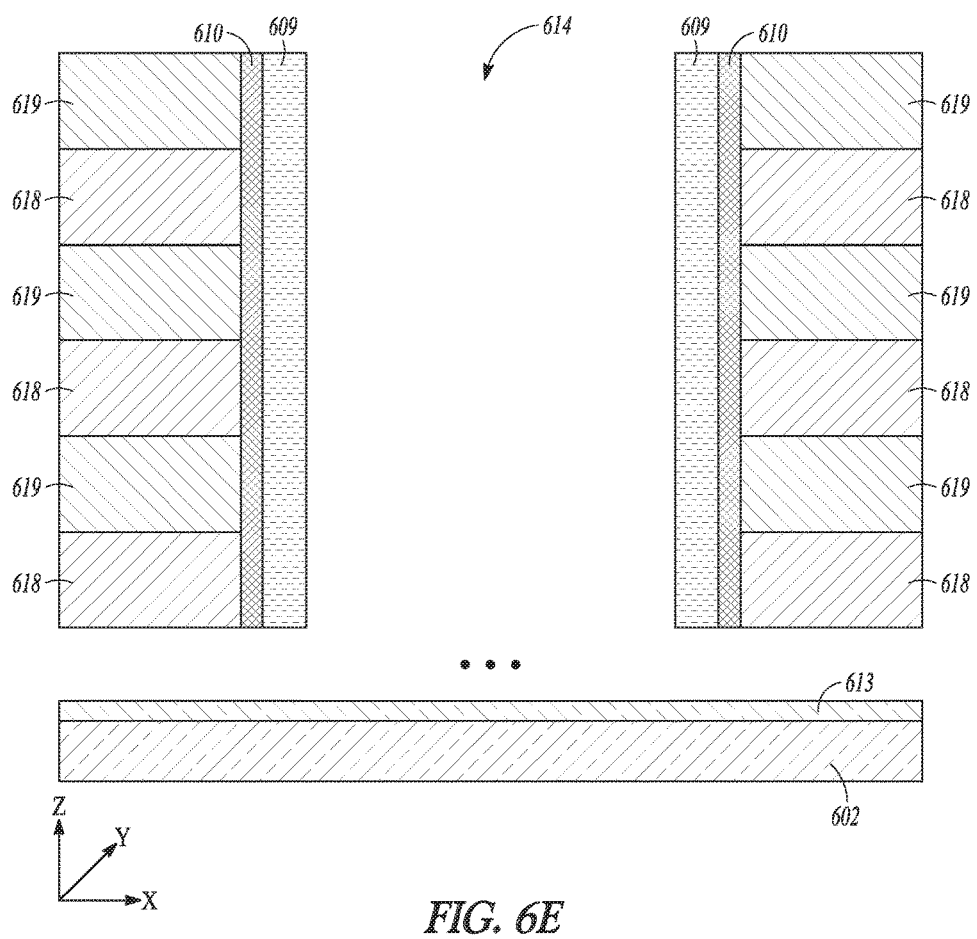
Figure 6F:
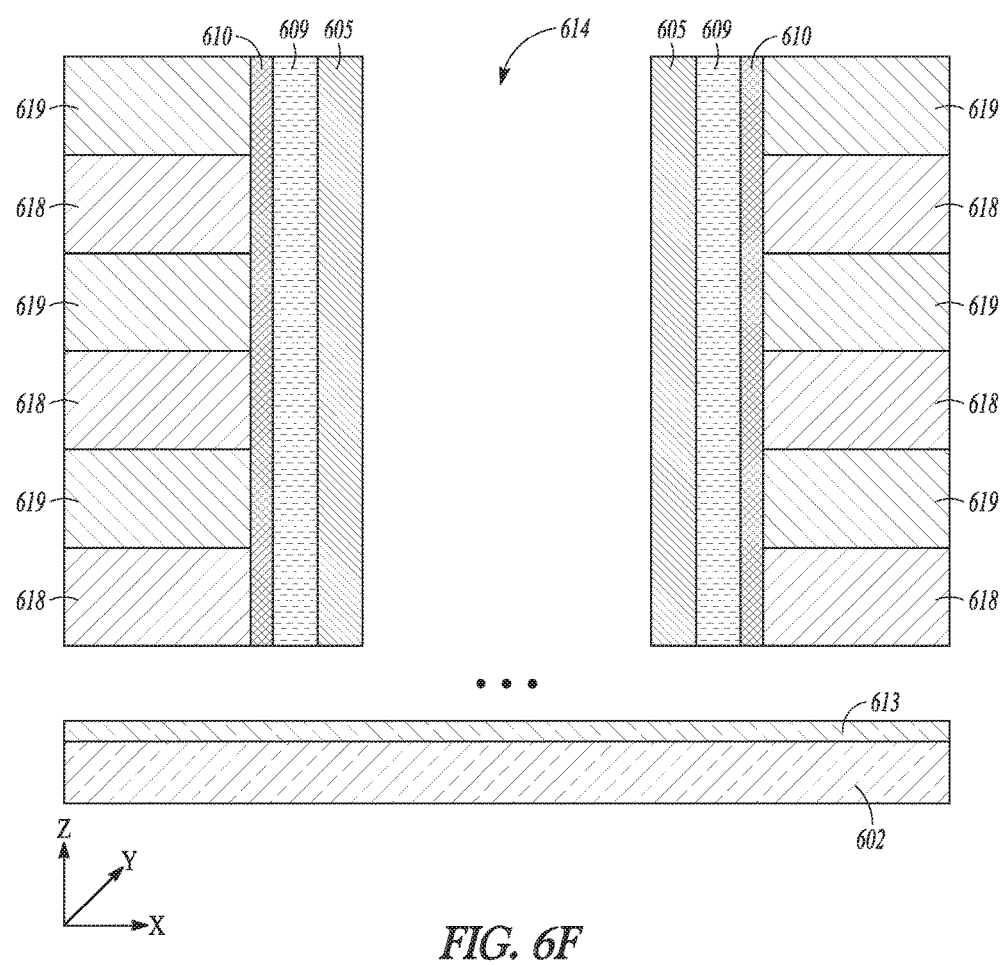
Figure 6G:
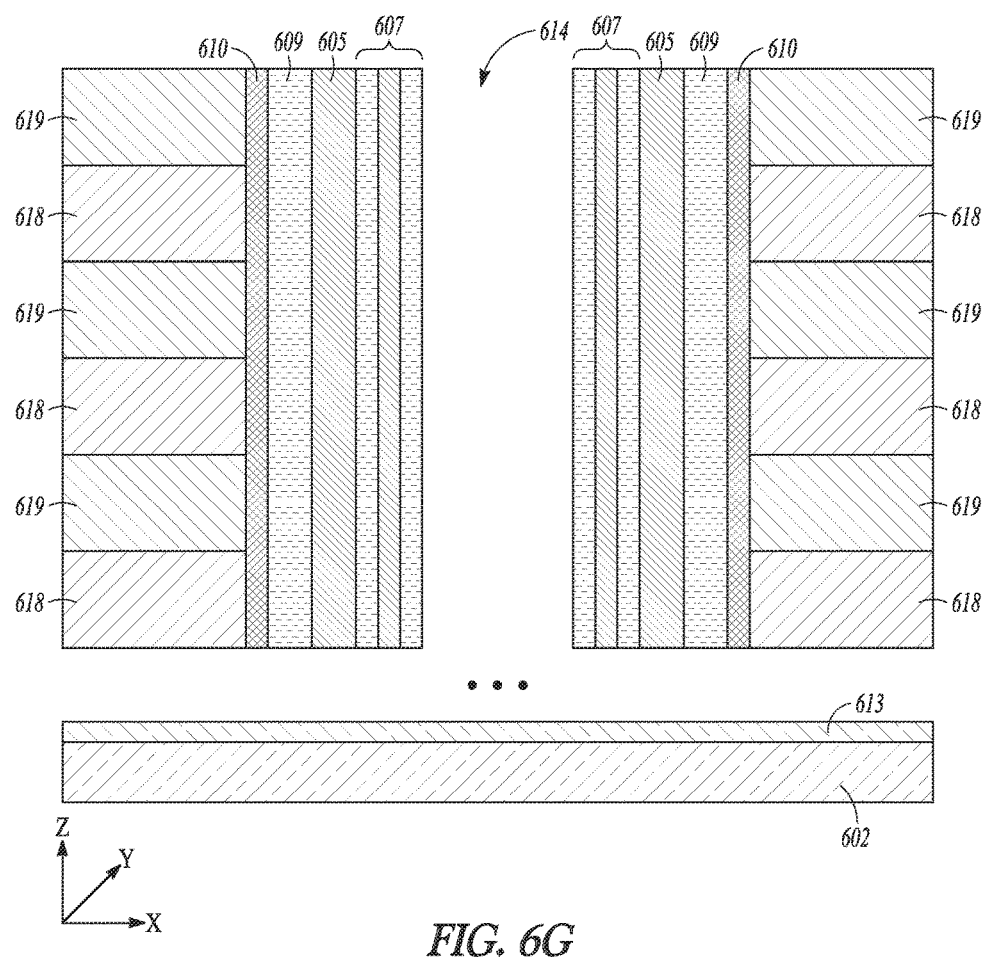
Figure 6H:
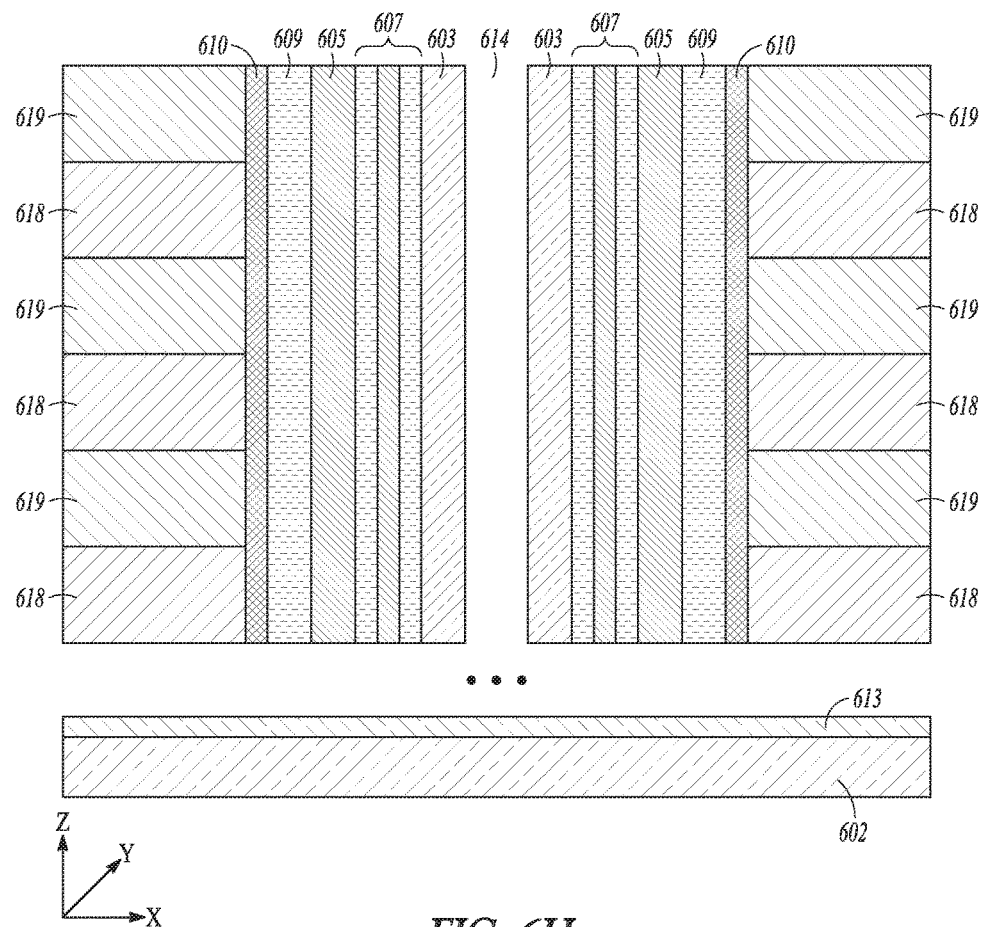
Figure 6I:
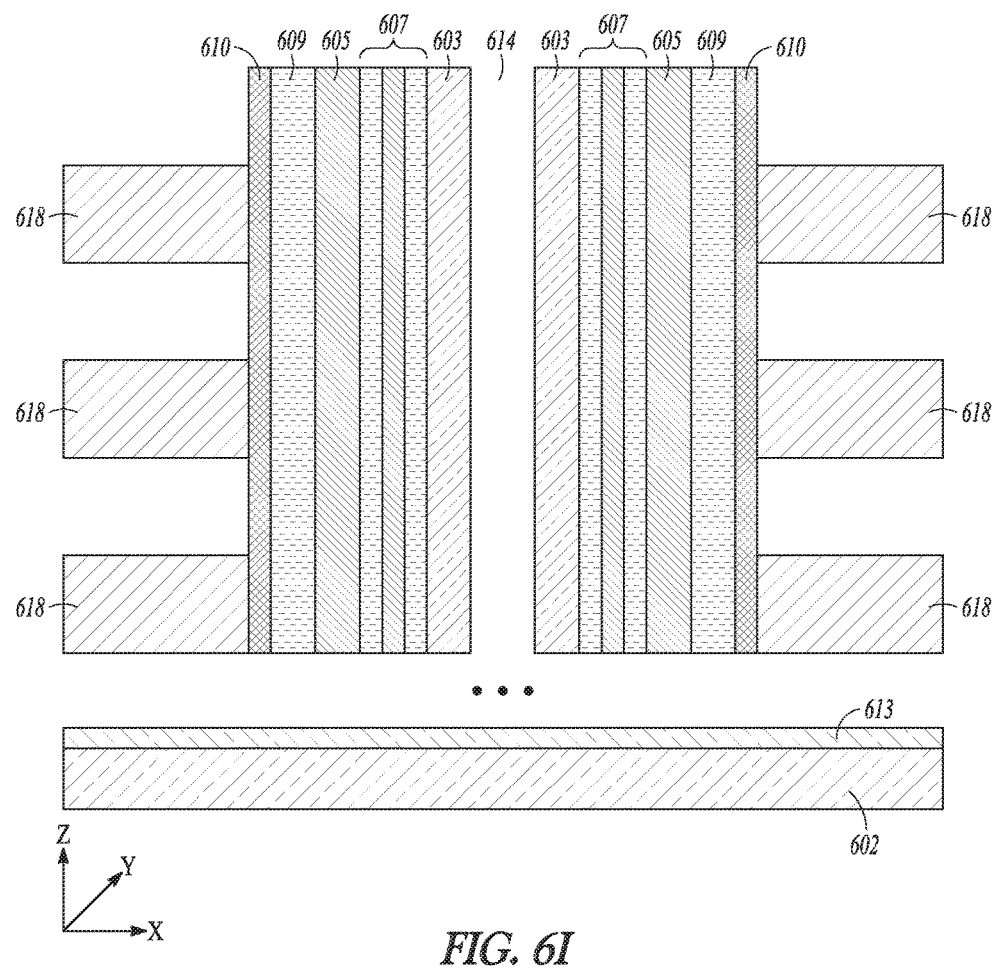
Figure 6J:
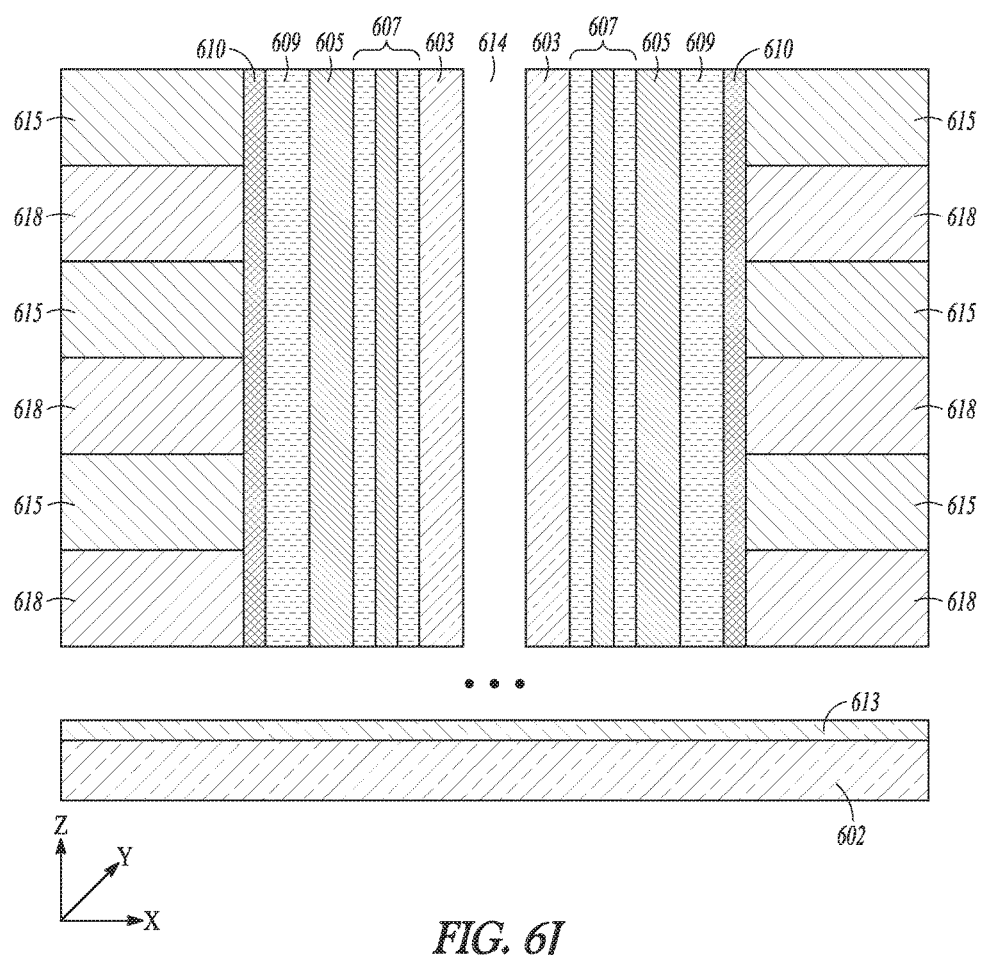
Figure 6K:
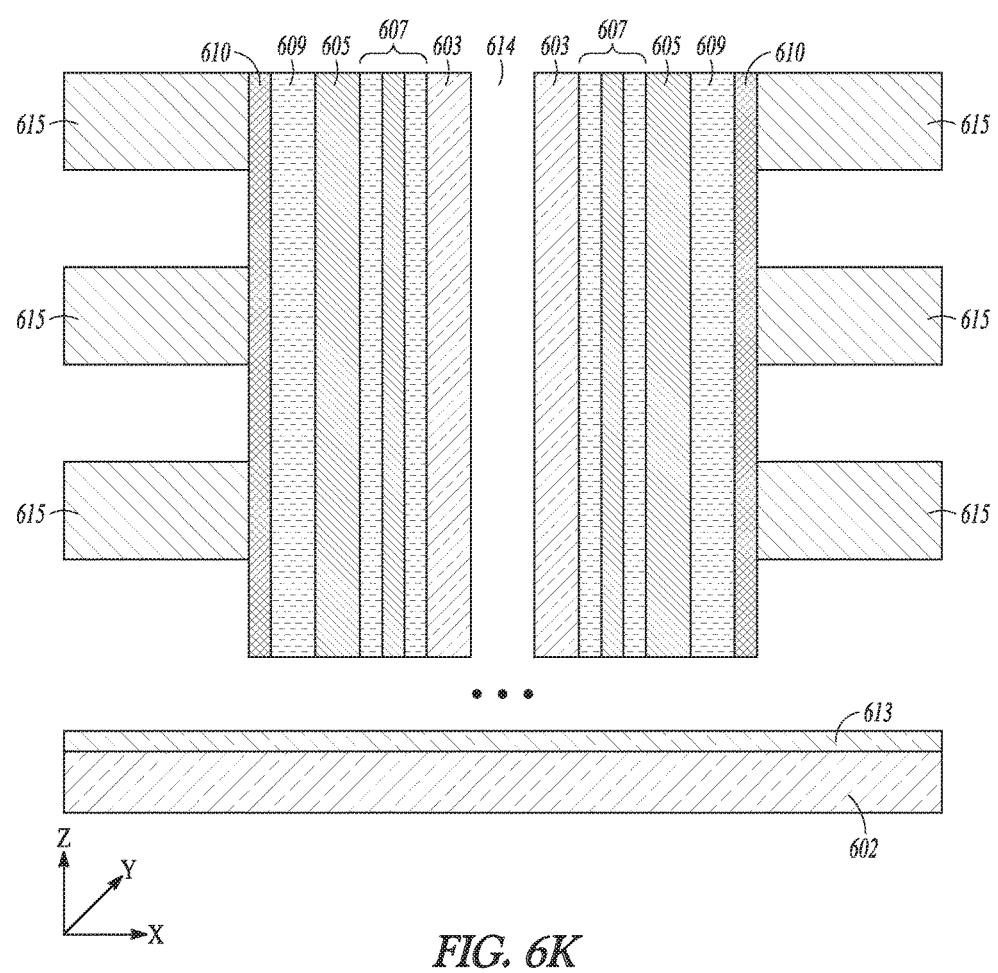
Figure 6L:
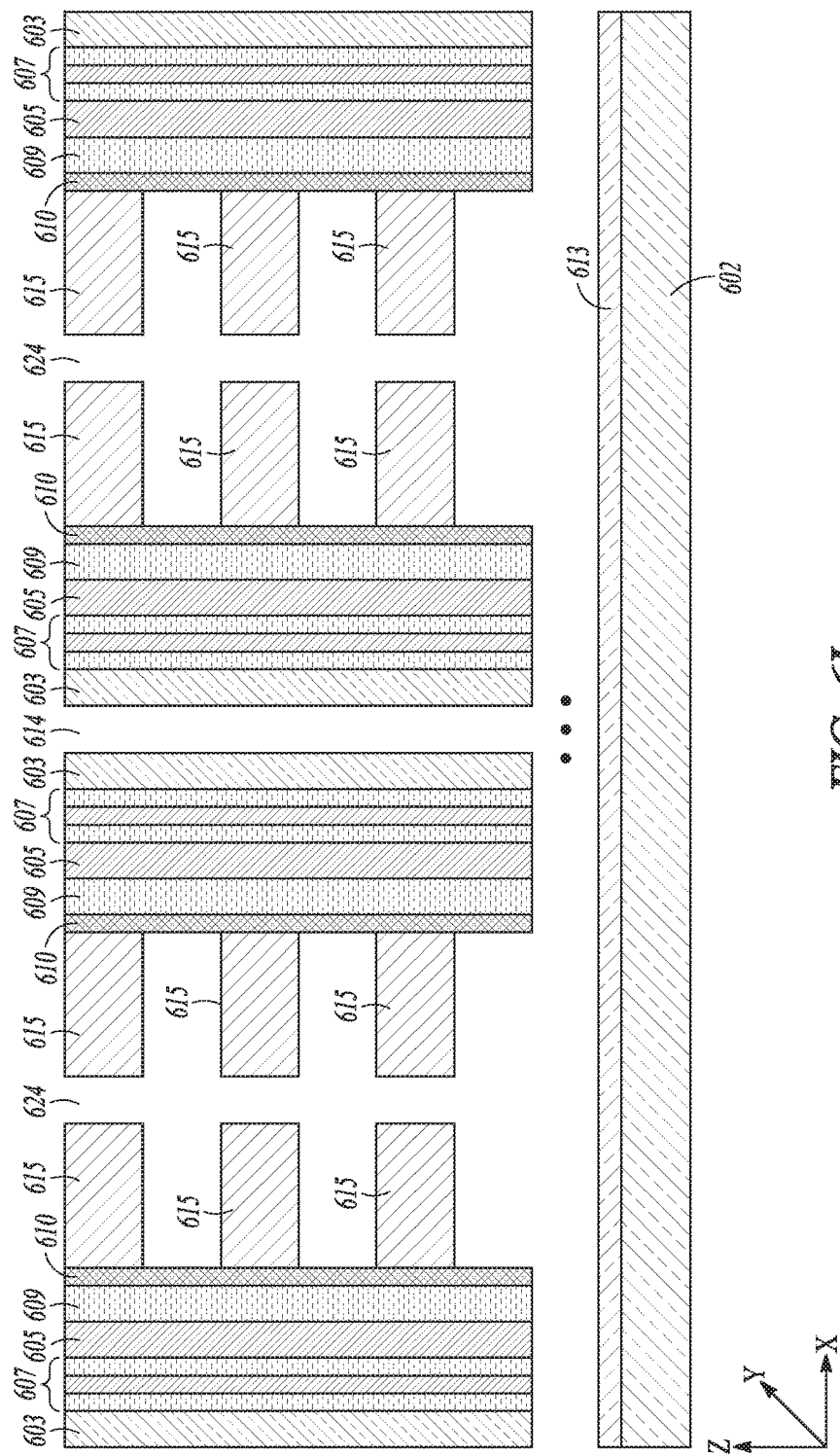
Figure 6M:
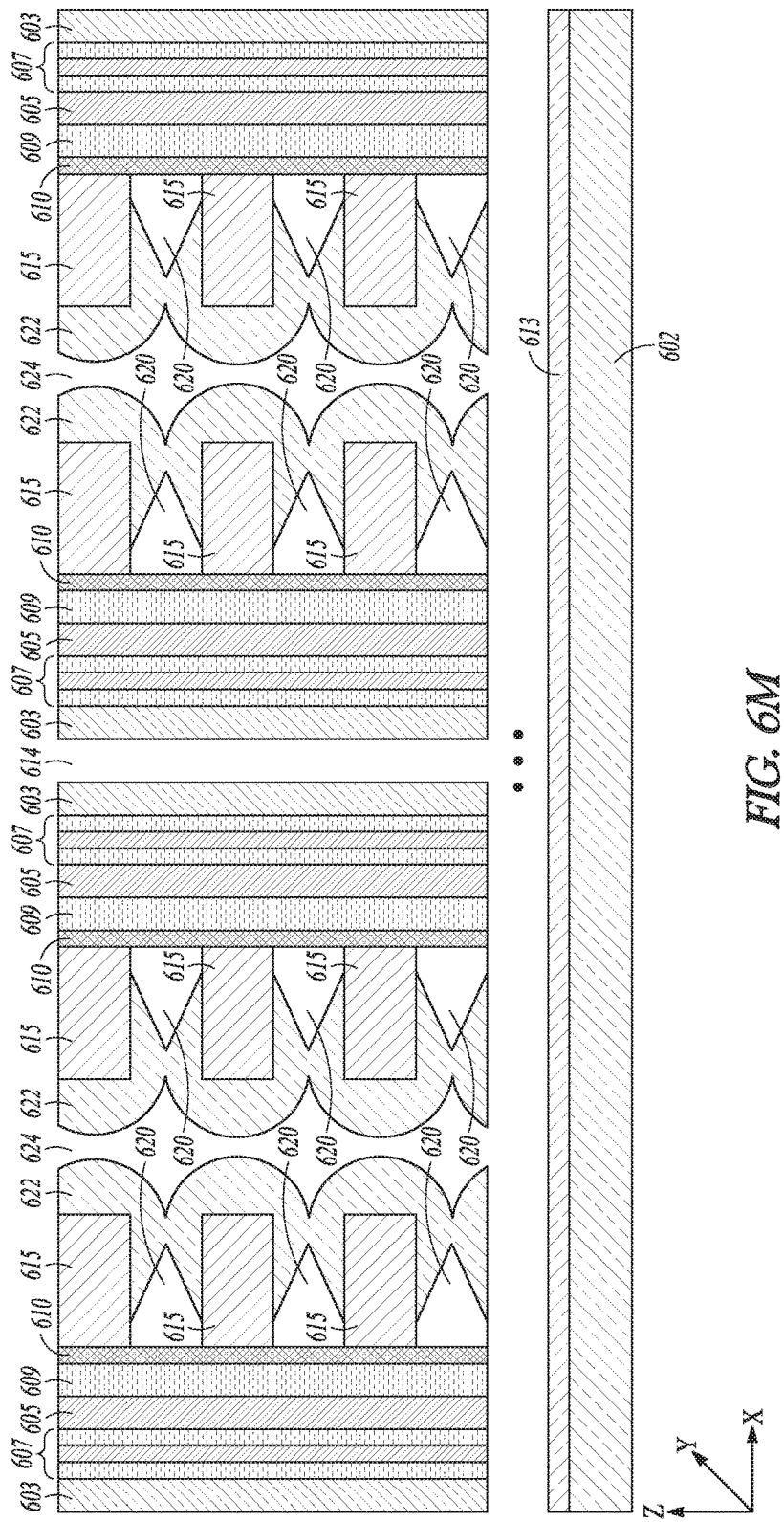
Figure 6N:
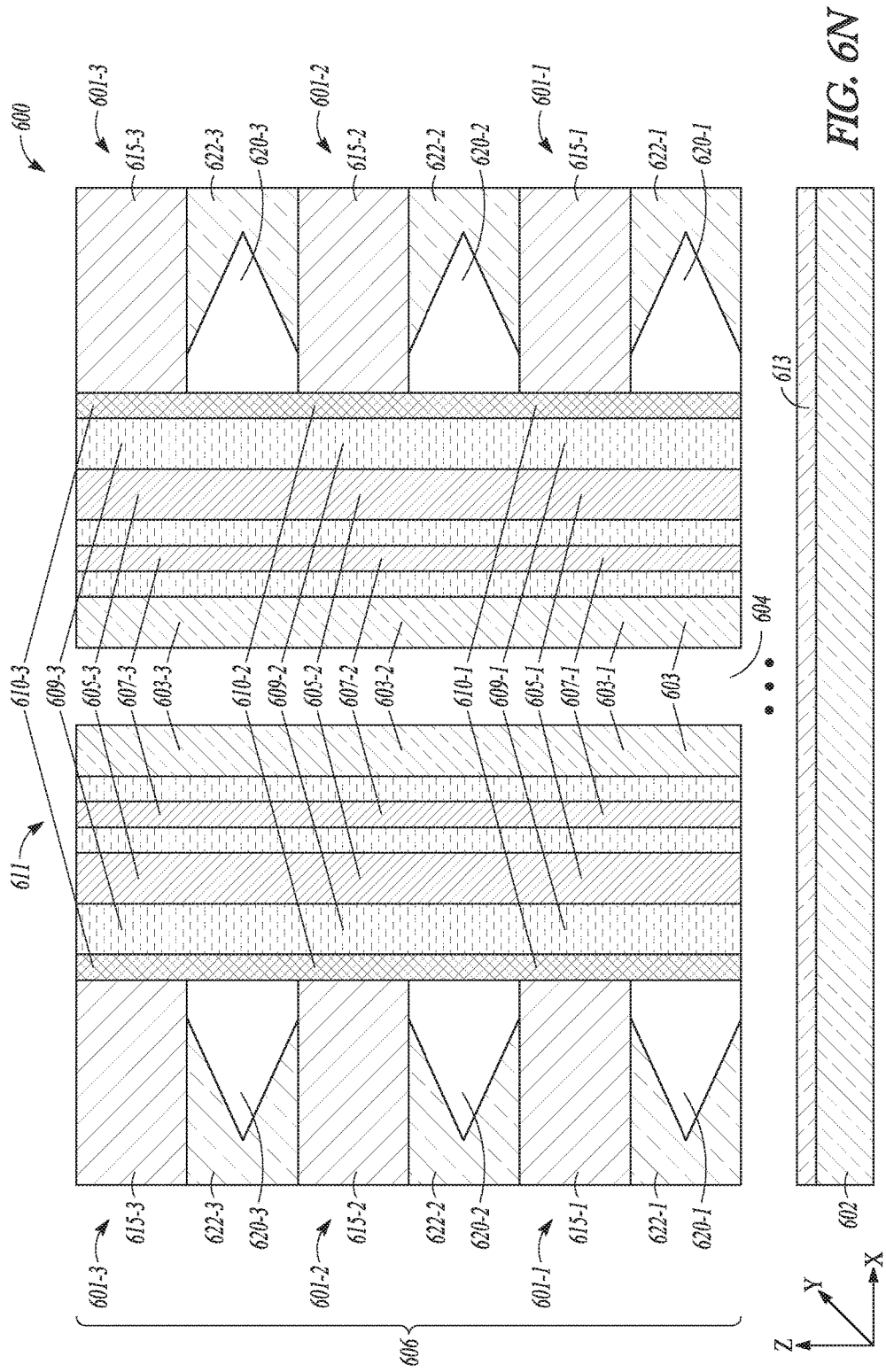

FIGS. 6A-6N are cross-sectional views illustrating features of stages of an embodiment of forming multiple CT structures in an electronic device. FIG. 6A shows a material stack 621 above a conductive region 613 on substrate 602. Material stack 612 includes alternating isolation dielectrics 618 and sacrificial regions 619 above conductive region 613. The number of alternating isolation dielectrics 618 and sacrificial regions 619 may depend on the number of CT structures being formed in a vertical stack. In a 3D memory device, this number can depend on the number of tiers in a memory array of the memory device, for example, a pair of isolation dielectric 618 and sacrificial region 619 for each tier. Three isolation dielectrics 618 and three sacrificial regions 619, which can correspond to three tiers in a memory array of a memory device, are shown in FIG. 6A for ease of discussion. Isolation dielectrics 618 can include, but are not limited to, an oxide such as silicon oxide, and sacrificial regions 619 can include but are not limited to, a nitride such as silicon nitride. The choice of material for isolation dielectrics 618 and sacrificial regions 619 can depend on the temperatures and chemistries used in fabricating multiple CT structures.

Conductive region 613 can be a semiconductor region 613. Semiconductor region 613 may be formed including poly silicon. In FIGS. 6A-6N, a space is shown between conductive region 613 on substrate 602 and the lowest isolation dielectric 618 vertically from conductive region 613 to indicate that there may be additional materials and/or integrated circuit structures between this isolation dielectric 618 and conductive region 613.

FIG. 6B shows material stack 621 after a removal process has been conducted to form trenches 614 in which pillars for CT structures are being formed. The removal process can include masking areas and etching material stack 621 in the locations for the trenches 614. Trenches 614 may be referred to as open pillars 614 in material stack 621. Each open pillar 614 may become a separate individual string of CT structures in a memory array of a memory device. Each open pillar 614 may be cylindrical-like in shape or have some other similar shape that extends vertically though material stack 621 (z-direction), but extends a relatively short distance in material stack 621 in the y-direction. In FIG. 6B, open pillars 614 are arranged along conductive region 613 in the x-direction, where multiple CT structures will be stacked on each other in the z-direction in each open pillar 614. Though not shown for ease of discussion, open pillars 614 can be formed in the y-direction with multiple CT structures stacked on each other in the z-direction in each open pillar 614 in the y-direction. See, for example, FIG. 2.

FIG. 6C shows one of the open pillars 614 associated with FIG. 6B. The figures following 6C show processing of this open pillar 614, where such processing is being performed on the other similar open pillars associated with material stack 621 of FIG. 6B. FIG. 6D shows a material for a dielectric barrier 610 formed on a wall of open pillar 614 of FIG. 6C. Forming the material for dielectric barrier 610 can include depositing one or more of aluminum oxide, hafnium oxide, zirconium oxide, and mixtures of hafnium oxide and/or zirconium oxide with one or more of aluminum oxide, silicon oxide, titanium oxide, gadolinium oxide, niobium oxide, or tantalum oxide. The deposition can be performed using one or more of a number of deposition processes. For example, the deposition can be implemented using chemical vapor deposition (CVD), atomic layer deposition (ALD), or other process suitable for forming a 3D memory device. These deposition techniques can be used in depositing material at various stages of forming the multiple CTs associated with FIGS. 6A-6N.

ALD allows formation of a region as a nanolaminate of a number of different compounds in each of sub-region of the region with the formed region having a total thickness in the nanometer region. The term "nanolaminate" means a composite film of ultra thin layers of two or more materials in a layered stack. Typically, each layer in a nanolaminate has a thickness of an order of magnitude in the nanometer range. Further, each individual material layer of the nanolaminate may have a thickness as low as a monolayer of the material or as high as 5 nanometers. The material for dielectric barrier 610 can be formed with a thickness from the wall of the open pillar 614 in the range of 20 to 50 angstroms.

FIG. 6E shows a material for dielectric blocking region 609 formed on a surface of the material for dielectric barrier 610 opposite the wall of the open pillar 614. The material for dielectric blocking region 609 can include silicon oxide or other dielectric material. FIG. 6F shows material for a charge trap region 605 formed on a surface of the material for dielectric blocking region 609 opposite the surface of the material for dielectric barrier 610. The material for charge trap region 605 can include a dielectric nitride. For example, a dielectric nitride of charge trap region 605 can include silicon nitride.

FIG. 6G shows material for a tunnel region 607 formed on the material for charge trap region 605. The material for tunnel region 607 can be implemented as a three region tunnel barrier as shown in FIG. 6E. Such a three region tunnel barrier can be implemented as a region of dielectric oxide followed by a region of dielectric nitride followed by another region of dielectric oxide. Alternatively, the material for tunnel region 607 may be implemented as a two region tunnel barrier. Also, the material for tunnel region 607 may be implemented as a one region tunnel barrier. Further, the material for tunnel region 607 may have four or more than regions, where the selection of material and thicknesses depends on the capability of the material with the given thicknesses to perform as a tunneling region to charge trap region 605. The material for tunnel region 607 can include one or more dielectrics such as silicon oxide or dielectrics having a dielectric constant greater than that of silicon dioxide.

FIG. 6H shows material for a semiconductor pillar 603 formed on the material for the material for tunnel region 607. The material for a semiconductor pillar 603 may be formed as a doped hollow channel. The doped hollow channel can be coupled to conductive region 613 via material and/or integrated circuit structures coupled on and contacting conductive region 613. For example, the material for semiconductor pillar 603 may be deposited to extend to and contact conductive region 613. Conductive region 613 can be formed as a semiconductor region 613 having a majority carrier concentration at a concentration level higher than the majority carrier concentration of semiconductor pillar 603. Semiconductor region 613 can be formed as a source region.

From the processed structure in FIG. 6H, procedures can be performed to generate gates and voids for CT structures of a completed device. On either side of the structure of open pillar 614 surrounded by materials for semiconductor pillar 603, tunnel region 607, dielectric blocking region 609, and dielectric barrier 610 along with portions of isolation dielectrics 618 and sacrificial regions 619 shown in FIG. 6H, vertical slits can be created through the set of isolation dielectrics 618 and sacrificial regions 619 to allow processing of isolation dielectrics 618 and sacrificial regions 619 adjacent the material for dielectric barrier 610 to form the appropriate gates and voids. See FIG. 6L for an example of slits between the processed open pillars 614. Such slits may have been created earlier in the process.

FIG. 6I shows the structure of FIG. 6H after sacrificial regions 619 have been removed, where after removal air occupies the previous sacrificial regions 619. The removal of sacrificial regions 619 can include etching the material of sacrificial regions 619 that is selective to the material for isolation regions 618 and the material for dielectric barrier 610. By selective is meant that the etchant that removes the sacrificial regions 619 does not remove the material for isolation regions 618 and the material for dielectric barrier 610. With the material for sacrificial regions 619 being a nitride such as silicon nitride, the material for isolation regions 618 being an oxide such as silicon oxide, and the material for dielectric barrier being a metal oxide such as $AlO_x$, the nitride of sacrificial regions 619 may be removed using a hot phosphoric acid etchant.

FIG. 6J shows the structure of FIG. 6I after deposition of material for gates 615 in the air regions that were previously sacrificial regions 619. This technique of depositing material for gates 615 is typically referred to as a replacement gate deposition. The material for gates 615 can include a metal. Such a metal can include, but is not limited to, tungsten. The material for gates 615 can include a compound of a metal and a non-metal, where the compound has metallic properties. The material for gates 615 can include, but is not limited to, conductive titanium nitride. The material for gates 615 can include combinations of materials. For example, the material for gates 615 can include, but is not limited to, conductive titanium nitride and tungsten. In some structures, conductive titanium nitride of gates 615 may separate the material for isolation regions 618 and the material for dielectric barrier 610 from tungsten of gates 615.

The deposition of the material for gates 615 can be made with material at temperatures using deposition techniques that are selective to the material for isolation regions 618 and the material for dielectric barrier 610. By selective deposition with respect to the material for isolation regions 618 and the material for dielectric barrier 610 is meant that the selected material for deposition is deposited at the desired location without substantial interaction with the material for isolation regions 618 and the material for dielectric barrier 610. Interaction at the interfaces with the material the material for isolation regions 618 and the material for dielectric barrier 610 may occur, but leaving the material for isolation regions 618 and the material for dielectric barrier 610 substantially as before the deposition. For forming strings of memory cells in a memory device, forming the material for gates 615 can include isolating the material for gates 615 coupled to or integrated with access lines for the memory array. These access lines may be word lines.

FIG. 6K shows the structure of FIG. 6J after the material for isolation regions 618 between the material for gates 615 has been removed. The removal of the tiers of isolation regions 618 is performed using a chemistry selected in conjunction with the selection of the material for gates 615 and the material for dielectric barrier 610. A criterion used for the selection can include selecting a chemistry that is selective to the material for gates 615 and material for dielectric barrier 610 such that the chemistry does not substantially affect the material for gates 615 and the material for dielectric barrier 610. The material for dielectric barrier 610 acts as a mask that allows tiers of isolation regions 618 to be removed without removing material for dielectric blocking region 609. Removal of tiers of isolation regions 618 may include use of hydrogen fluoride (HF), a vapor etch, or other chemistry that the material for dielectric barrier 610 can withstand so that the underlying material for the dielectric blocking region 609 is not removed with the removal of tiers of isolation regions 618.

The material for dielectric barrier 610, such as $AlO_x$ or other high-κ material are to be deposited to be able to resist both a hot phosphoric acid removal of sacrificial regions 619, such as a nitride removal, as well as a HF or other chemistry used for removal of isolation regions 618, such as an oxide tier removal. For $AlO_x$, there are high temperature ALD processes, as well as halide based ALD processes, that may be implemented for the deposition of $AlO_x$ to withstand these chemistries. Halide processes exist for deposition of $HfO_x$ and other high-κ materials that may be implemented such that these deposited films stand up to the hot phosphoric acid as well as the HF and other oxide etch chemistries. Other processes for forming $HfO_x$ and/or other high-κ materials for dielectric barrier 610, such that they survive removal processes, may include use of standard metal organic ALD precursors. Other processes to condition dielectric barrier 610 to survive removal processes may include using various treatments after ALD deposition. These other processes may include anneals (either in inert or reactive ambients), plasma treatments, etc.

FIG. 6L shows the structure of FIG. 6K with respect to slits 624 in the x-direction to the sides of the CTs being formed in open pillar 614. FIG. 6L also indicates that other strings with CTs in a vertical stack are being processed with the structure of FIG. 6K. FIG. 6M shows the structure of FIG. 6L after dielectrics 622 are deposited via slits 624 to form voids 620 between gates 615 of adjacent CTs. Dielectrics 622 can be formed in a "pinch off" sealing process to seal voids 620. The sealing process can be implemented using plasma-enhanced chemical vapor deposition (PECVD) or other depleting process. In forming a seal, using PECVD or other deposition process that is not completely conformal can provide a void. In such cases, the sealing films are typically deposited at sub atmospheric pressures of a few mTorr to a few Torr. This pressure remains inside the void after it is sealed up. This void may be referred to as an "air gap," but the composition of gases would be that of the process when the void was sealed.

This sealing process in forming CT memory cells for memory arrays of a memory device forms voids 620 between gates that are coupled to or integrated with access lines. For each region between adjacent gates 615, dielectric 622 can be formed surfaces of both the adjacent gates 615 extending towards the material for the dielectric barrier 610. In some embodiments, dielectric 622 may extend along surfaces of both the adjacent gates 615 to contact the dielectric barrier 610, which may result in a smaller void than with the sealing process controlled, for example by a timed termination of the sealing process, such that dielectric 622 does not contact dielectric barrier 610.

FIG. 6N illustrates a cross-sectional representation of an embodiment of a string 611 having multiple CTs in an electronic apparatus 600 resulting from processing in accordance with processing features illustrated in FIGS. 6A-6M. The multiple CTs in an electronic apparatus 600 can be structured similar or identical to the CTs of memory device 300 of FIG. 3. Though the number of CTs shown is three, string 611 can have more or less than three CTs in string 611. As noted in the discussion herein, electronic apparatus may be realized as a memory device having multiple strings of CT memory cells, where each memory cell is identical or similar except that that electrical connections to and locations within the memory array of the memory device will differ.

Vertical string 611 includes a vertical pillar 603 of semiconductor material coupled to and part of CT structures 601-1, 601-2, and 601-3 in a vertical stack 606 along or as part of vertical string 611 above conductive region 613 on substrate 602. In FIG. 6N, a space is shown between the bottom of stack 606 and conductive region 613 to indicate that there may be additional materials and/or integrated circuit structures between the bottom of stack 606 and conductive region 613. In various applications, such additional integrated materials may include, for example, source-side select transistor material. Depending on the architecture of electronic apparatus 600 that may include a memory device, conductive region 613 may be a source region. Conductive region 613 may include semiconductor material. The semiconductor material may include, but is not limited to, monocrystalline silicon or polycrystalline silicon. Substrate 602 may be a semiconductor substrate or a substrate having a combination of semiconductor material and insulating material.

CT structure 601-1 is arranged as a first charge trap structure along vertical string 611, above which charge trap structures 601-2 and 601-3 are arranged in vertical stack 606 with each of charge trap structures 601-2 and 601-3 are disposed above another CT structure of vertical stack 606. The semiconductor material of semiconductor pillar 603 is arranged as a channel 603-1, 603-2, and 603-3 for CT structures 601-1, 601-2, and 601-3, respectively. Each of CT structures 601-1, 601-2, and 601-3 includes a tunnel region 607-1, 607-2, and 607-3, respectively, adjacent and contacting their respective channels 603-1, 603-2, and 603-3. Each of tunnel regions 607-1, 607-2, and 607-3 can be implemented as set of barriers, for example, a three region tunnel barrier. Such a three region tunnel barrier can be implemented as a region of dielectric oxide followed by a region of dielectric nitride followed by another region of dielectric oxide. Each of tunnel regions 607-1, 607-2, and 607-3 may be implemented as a two region tunnel barrier. Each of tunnel regions 607-1, 607-2, and 607-3 may be implemented as a one region tunnel barrier. Further, each of tunnel regions 607-1, 607-2, and 607-3 may have four or more regions, where the selection of material and thicknesses of these tunnel regions depends on the capability of the material with the given thicknesses to perform as a tunneling region.

Each of CT structures 601-1, 601-2, and 601-3 includes a charge trap region 605-1, 605-2, and 605-3, respectively, adjacent and contacting their respective tunnel regions 607-1, 607-2, and 607-3. Each of charge trap regions 605-1, 605-2, and 605-3 can be a dielectric material that can store charge from channels 603-1, 603-2, and 603-3, respectively. Charge trap regions 605-1, 605-2, and 605-3 can be a dielectric nitride region such as, for example, a region including dielectric silicon nitride. Other dielectric materials for charge trap regions 605-1, 605-2, and 605-3 can be used to trap charge. Each of CT structures 601-1, 601-2, and 601-3 includes a dielectric blocking region 609-1, 609-2, and 609-3, respectively, adjacent and contacting their respective charge trap region 605-1, 605-2, and 605-3.

Each of CT structures 601-1, 601-2, and 601-3 include a dielectric barrier 610-1, 610-2, and 610-3 and a gate 615-1, 615-2, and 615-3, respectively, where each dielectric barrier 610-1, 610-2, and 610-3 is disposed between dielectric blocking region 609-1, 609-2, and 609-3 and gates 615-1, 615-2, and 615-3 of their respective CT structures 601-1, 601-2, and 601-3. Each of dielectric barriers 610-1, 610-2, and 610-3 can be implemented using materials for the dielectric barriers selected to enable processing of voids between CT structures 601-1, 601-2, and 601-3 arranged in the 3D stack 606 associated with string 611. 3D stack 606 can be realized as a 3D NAND stack 606. Each of dielectric barriers 610-1, 610-2, and 610-3 can include an aluminum oxide or a dielectric having a dielectric constant greater than that of aluminum oxide.

Each dielectric barrier 610-1, 610-2, and 610-3 extends to the dielectric barrier of an adjacent CT structure and is arranged with gate 615-1, 615-2, and 615-3 of its respective CT structure 601-1, 601-2, and 601-3 and the gate of the adjacent charge trap structure, providing a void between the charge trap structure and the adjacent charge trap structure. Dielectric barrier 610-3 of CT structure 601-3 extends to dielectric barrier 610-2 of CT structure 601-2 and is arranged with gate 615-3 of CT structure 601-3 and gate 615-2 of adjacent CT structure 601-2 such that void 620-3 is provided. Dielectric barrier 610-2 of CT structure 601-2 extends to dielectric barrier 610-1 of CT structure 601-1 and is arranged with gate 615-2 of CT structure 601-2 and gate 615-1 of adjacent CT structure 601-1 such that void 620-2 is provided. Each CT structure 601-1, 601-2, and 601-3 is arranged with an adjacent CT structure, vertically up or vertically down in stack 606 associated with vertical string 611. In addition, dielectric barrier 610-1 of CT structure 601-1 extends to a region on which stack 606 is disposed. The region may be an isolation region or another active device area such as an access transistor that couples stack 606 to conductive region 613 on substrate 602. Dielectric barrier 610-1 of CT structure 601-1 is arranged with gate 615-1 of CT structure 601-1 and the region on which stack 606 is disposed such that void 620-1 is provided. Alternatively, string 611 can be structured directly on conductive region 613, where electrical isolation between gate 615-1 and conductive region 613 is provided at least in part by void 620-1.

Each of voids 620-1, 620-2, and 620-3 can be sealed by a dielectric region 622-1, 622-2, and 622-3, respectively. Dielectric region 622-1 is located on the region on which stack 606 is disposed (alternatively conductive region 613) and extends to and is located on gate 615-1 of CT 601-1. Void 620-1 is contained within dielectric barrier 610-1 extended to the region on which stack 606 is disposed (alternatively conductive region 613), gate 615-1, dielectric region 622-1 on gate 615-1, the region on which stack 606 is disposed (alternatively conductive region 613), and dielectric region 622-1 on the region on which stack 606 is disposed (alternatively conductive region 613).

Dielectric region 622-2 is located on gate 615-2 of CT structure 601-2 and extends to and is located on gate 615-1 of CT 601-1. Void 620-2 is contained within dielectric barrier 610-2 extended to dielectric barrier 610-1, gate 615-2, dielectric region 622-2 on gate 615-2 of CT structure 601-2, gate 615-1 of adjacent CT structure 601-1, and dielectric region 622-2 on gate 615-1 of CT structure 601-1.

Dielectric region 622-3 is located on gate 615-3 of CT 601-3 and extends to and is located on gate 615-2 of CT structure 601-2. Void 620-3 is contained within dielectric barrier 610-3 extended to dielectric barrier 610-2, gate 615-3, dielectric region 622-3 on gate 615-3 of CT structure 601-3, gate 615-2 of adjacent CT structure 601-2, and dielectric region 622-3 on gate 615-2 of CT structure 601-2.

In some variations, dielectric regions 622-1, 622-2, and 622-3 may extend along the surfaces of the gates between which they are respectively located to the dielectric barrier extending between adjacent CT structures that are separated by the respective dielectric regions 622-1, 622-2, and 622-3. In such variations, each associated void is contained within a dielectric barrier, a dielectric region on the gate of a charge trap structure, and a dielectric region on the gate of an adjacent charge trap structure. Such voids may be smaller than those in which the sealing dielectrics do not extend to their associated dielectric barriers. The voids between gates of adjacent CT structures can be largest in vertical extent at the dielectric barriers between the adjacent CT structures.

As can be seen in FIG. 6N, tunnel regions 607-1, 607-2, and 607-3, charge trap regions 605-1, 605-2 and 605-3, dielectric blocking regions 609-1, 609-2, and 609-3 of electronic apparatus 600 can be implemented similar to or identical to tunnel regions 307-1, 307-2, and 307-3, charge trap regions 305-1, 305-3 and 305-3, dielectric blocking regions 309-1, 309-2, and 309-3 of memory device 300 of FIG. 3.

Semiconductor pillar 603 of string 611 of memory device 600 can be structured as a doped semiconductor hollow channel. Semiconductor pillar 603 can include poly silicon as a hollow channel surrounding a dielectric 604. Semiconductor pillar 603 can operatively conduct a current between conductive region 613 and a conductive data line coupled to semiconductor pillar 603. Such conductive data line may be coupled to semiconductor pillar 603 by an access transistor. In various 3D memory architectures, such arrangement of conductive region 613 and a conductive data line coupled to semiconductor pillar 603 can be provided with conductive region 613 being a source region and conductive data line.

The conductive data line can be a bit line. The current can be affected by the charge stored in CT structures 601-1, 601-2, and 601-3 along string 611, where control of storing the charge is by the gates 615-1, 615-2, and 615-3 of CT structures 601-1, 601-2, and 601-3. Gates 615-1, 615-2, and 615-3 can be incorporated in access lines of electronic apparatus of 600. The access lines may be word lines.

As with the memory device 300 of FIG. 3, voids 620-1, 620-2, and 630-3 between CT structure 601-1 and the region on which stack 606 is disposed (alternatively conductive region 613), between CT structures 601-2 and 601-1, and between CT structures 601-3 and 601-2 provide voids between access lines of electronic apparatus 600. These voids can decrease access line (gate) to access line (gate) capacitance relative to using conventional dielectric materials between such access lines. Using voids, such as voids 620-1, 620-2, and 630-3, for an acceptable capacitance, can allow the distance between access lines (gates) to CT cells to be smaller, allowing more room for the access lines (gates) to CT cells, that is, access lines (gates) can be vertically wider, which can lower the access line resistance.

Using features associated with methods of forming one or more CTs, taught herein, a memory device can include a number of CT memory cells. A memory device can comprise: a number of vertical strings, where each vertical string includes a vertical pillar of semiconductor material; and multiple charge trap structures arranged in a vertical stack of each string with each charge trap structure vertically adjacent another one of the multiple charge trap structures in the vertical stack. Each charge trap structure can include: a tunnel region adjacent and contacting the vertical pillar; a charge trap region adjacent and contacting the tunnel region; a dielectric blocking region adjacent and contacting the charge trap region; a gate, the gate separated by a void from the gate of an adjacent charge trap structure; and a dielectric barrier between the dielectric blocking region and the gate. The void can be contained within the dielectric barrier, a dielectric region on the gate of the charge trap structure, and a dielectric on the gate of the adjacent charge trap structure.

The memory device may include a number of arrangements of the multiple charge trap structures in the vertical stack. The tunnel region can extend along the vertical pillar of semiconductor material and can extend through the other charge trap structures as the tunnel region of each charge trap structure. The charge trap region can extend along the vertical pillar of semiconductor material and can extend through the other charge trap structures as the charge trap region of each charge trap structure. The dielectric blocking region of the first charge trap structure can extend along the vertical pillar of semiconductor material and can extend through the other charge trap structures as the dielectric blocking region of each charge trap structure. The dielectric barrier can extend along the vertical pillar of semiconductor material and can extend through the other charge trap structures as the dielectric barrier of each charge trap structure.

The memory device may include a number of features in each charge trap structure. The dielectric barrier can include aluminum oxide or a dielectric having a dielectric constant greater than that of aluminum oxide. The vertical pillar can be structured as a doped hollow channel. The doped hollow channel can include poly silicon surrounding a dielectric. The gates can be incorporated in access lines of a memory array of the memory device.

Figure 7:
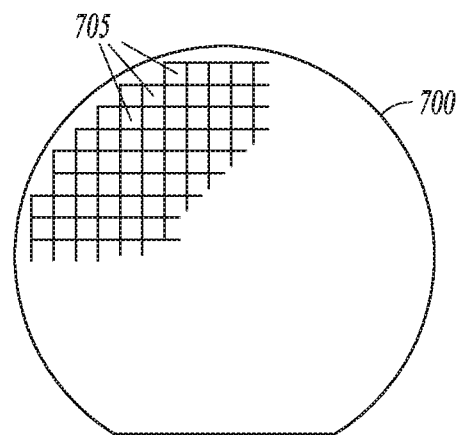
FIG. 7 illustrates an example wafer having multiple die, according to various embodiments.

FIG. 7 illustrates an embodiment of an example of a wafer 700 arranged to provide multiple electronic components. Wafer 700 can be provided as a wafer in which a number of dice 705 can be fabricated. Alternatively, wafer 700 can be provided as a wafer in which the number of dice 705 have been processed to provide electronic functionality and are awaiting singulation from wafer 700 for packaging. Wafer 700 can be provided as a semiconductor wafer, a semiconductor on insulator wafer, or other appropriate wafer for processing electronic devices such as an integrated circuit chips. Wafer 700 can be fabricated in accordance with methods associated with any embodiment or combination of embodiments related to FIGS. 1-6.

Using various masking and processing techniques, each die 705 can be processed to include functional circuitry such that each die 705 is fabricated as an integrated circuit with the same functionality and packaged structure as the other dice on wafer 700. Alternatively, using various masking and processing techniques, various sets of dice 705 can be processed to include functional circuitry such that not all of the dice 705 are fabricated as an integrated circuit with the same functionality and packaged structure as the other dice on wafer 700. A packaged die having circuits integrated thereon providing electronic capabilities is herein referred to as an integrated circuit (IC).

Wafer 700 can comprise multiple dice 705. Each die 705 of the multiple dice can include a charge trap structure. The charge trap structure and similar charge trap structures can include various of the features for charge flash structures associated with FIGS. 1-6. The charge trap structure can include a semiconductor pillar operable to conduct a current; a charge trap region separated from the semiconductor pillar by a tunnel region; a dielectric blocking region on the charge trap region; a gate on the dielectric blocking region to control storage of charge in the charge trap region, the gate separated by a void from a region which the charge trap structure is directly disposed; and a dielectric barrier separating the dielectric blocking region from the gate. The dielectric barrier may be in an arrangement with the gate such that there is a void between the gate and the region which the charge trap structure is directly disposed. The void can be contained within the dielectric barrier, a dielectric region on and contacting the gate, and the region which the charge trap structure is directly disposed.

The charge trap structure of each die 705 can be one of multiple charge trap structures arranged in a vertical stack along a vertical string of a number of vertical strings, where each trap structure is vertically adjacent another one of the multiple charge trap structures in the vertical stack. Each charge trap structure along a respective vertical string can include: a semiconductor pillar for the charge trap structure that is a portion of semiconductor material arranged vertically along the vertical string for all charge trap structures along the vertical string; a tunnel region adjacent and contacting the semiconductor pillar, a charge trap region adjacent and contacting the tunnel region; a dielectric blocking region adjacent and contacting the charge trap region; a gate, where the gate is separated by a void from the gate of an adjacent charge trap structure; and a dielectric barrier between the dielectric blocking region and the gate. The dielectric barrier of each charge trap structure can extend to the dielectric barrier of an adjacent charge trap structure and can be arranged with the gate of the respective charge trap structure and the gate of the adjacent charge trap structure, providing a void between the charge trap structure and the adjacent charge trap structure. The dielectric barrier can include aluminum oxide or a dielectric having a dielectric constant greater than that of aluminum oxide. The semiconductor pillar can include poly silicon surrounding a dielectric.

Figure 8:
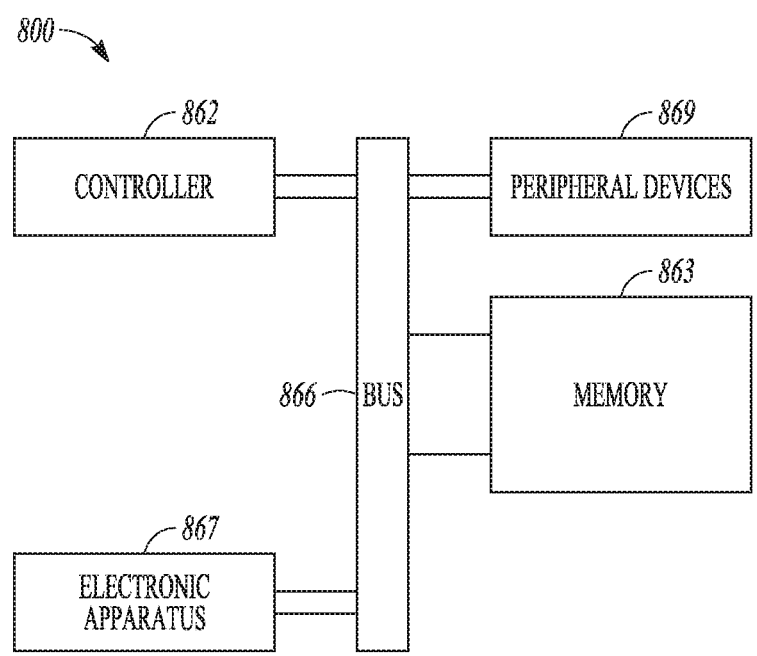
FIG. 8 shows a block diagram of an example system that includes a memory structured with an array of charge trap structures as memory cells, according to various embodiments.

FIG. 8 shows a block diagram of an embodiment of an example system 800 that includes a memory 863 structured with an array of CT structures as memory cells. The architectures of the CT structures and the memory can be realized in a manner similar to or identical to structures in accordance with various embodiments discussed herein. System 800 can include a controller 862 operatively coupled to memory 863. System 800 can also include an electronic apparatus 867 and peripheral devices 869. One or more of controller 862, memory 863, electronic apparatus 867, and peripheral devices 869 can be in the form of one or more ICs.

A bus 866 provides electrical conductivity between and/or among various components of system 800. In an embodiment, bus 866 can include an address bus, a data bus, and a control bus, each independently configured. In an alternative embodiment, bus 866 can use common conductive lines for providing one or more of address, data, or control, the use of which is regulated by controller 862. Controller 862 can be in the form or one or more processors.

Electronic apparatus 867 may include additional memory. Memory in system 800 may be constructed as one or more types of memory such as, but not limited to, dynamic random access memory (DRAM), static random access memory (SRAM), synchronous dynamic random access memory (SDRAM), synchronous graphics random access memory (SGRAM), double data rate dynamic ram (DDR), double data rate SDRAM, and magnetic based memory.

Peripheral devices 869 may include displays, imaging devices, printing devices, wireless devices, additional storage memory, and control devices that may operate in conjunction with controller 862. In various embodiments, system 800 includes, but is not limited to, fiber optic systems or devices, electro-optic systems or devices, optical systems or devices, imaging systems or devices, and information handling systems or devices such as wireless systems or devices, telecommunication systems or devices, and computers.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Thus, the following claims are hereby incorporated into the Detailed Description, with each claim standing on its own as a separate embodiment.

What is claimed is:

1. An apparatus comprising:
 a charge trap structure disposed above a substrate, the charge trap structure including
  a semiconductor pillar operable to conduct a current;
  a charge trap region separated from the semiconductor pillar by a tunnel region;
  a dielectric blocking region adjacent the charge trap region;
  a gate adjacent to the dielectric blocking region operable to control storage of charge in the charge trap region, at least a portion of the gate being separated from at least a portion of an adjacent gate by at least a void; and a dielectric barrier between the dielectric blocking region and the gate, with the dielectric barrier vertically contacting the gate, the adjacent gate, and extending from the gate to the adjacent gate, and with the dielectric barrier constructed to form at least a portion of a boundary of the void.

2. The apparatus of claim 1, wherein the void is contained within at least a portion of the dielectric barrier, at least a portion of the gate, at least a portion of the adjacent gate, and at least a portion of a dielectric region on the gate.

3. The apparatus of claim 1, wherein the dielectric barrier has a thickness in the range from about 15 angstroms to about 50 angstroms between the dielectric blocking region and the gate.

4. The apparatus of claim 1, wherein the tunnel region is an arrangement of two or three dielectric regions.

5. The apparatus of claim 4, wherein the charge trap region is a nitride region, the blocking dielectric region is an oxide region, the tunnel region includes an oxide and a nitride, the semiconductor pillar includes poly silicon, and the dielectric barrier includes aluminum oxide or a dielectric having a dielectric constant greater than that of aluminum oxide.

6. A memory device comprising:
a string of memory cells including a vertical pillar of semiconductor material; and
multiple charge trap structures arranged in a vertical stack with each charge trap structure vertically adjacent another one of the multiple charge trap structures in the vertical stack, each charge trap structure including:
a tunnel region adjacent and contacting the vertical pillar;
a charge trap region adjacent and contacting the tunnel region;
a dielectric blocking region adjacent and contacting the charge trap region;
a gate, at least a portion of the gate separated from at least a portion of the gate of an adjacent charge trap structure by at least a void; and
a dielectric barrier between the dielectric blocking region and the gate, with the dielectric barrier vertically contacting the gate, the gate of the adjacent charge trap structure, and extending from the gate to the gate of the adjacent charge trap structure, and with the dielectric barrier constructed to form at least a portion of a boundary of the void.

7. The memory device of claim 6, wherein the void is contained within at least a portion of the dielectric barrier, at least a portion of a dielectric region on at least a portion of the gate of the charge trap structure, and at least a portion of the dielectric region that is also on at least a portion of the gate of the adjacent charge trap structure.

8. The memory device of claim 6, wherein the tunnel region extends along the vertical pillar of semiconductor material and extends through the other charge trap structures as the tunnel region of each charge trap structure of the string.

9. The memory device of claim 6, wherein the charge trap region extends along the vertical pillar of semiconductor material and extends through the other charge trap structures as the charge trap region of each charge trap structure of the string.

10. The memory device of claim 6, wherein the dielectric blocking region extends along the vertical pillar of semiconductor material and extends through the other charge trap structures as the dielectric blocking region of each charge trap structure of the string.

11. The memory device of claim 6, wherein the dielectric barrier includes aluminum oxide.

12. The memory device of claim 6, wherein the dielectric barrier includes a dielectric material having a dielectric constant greater than that of aluminum oxide.

13. The memory device of claim 6, wherein the vertical pillar is structured as a doped hollow channel.

14. The memory device of claim 6, wherein the vertical pillar includes poly silicon surrounding a dielectric material.

15. The memory device of claim 6, wherein the gates are incorporated in access lines of a memory array of the memory device.

16. A method comprising:
forming a charge trap structure above a substrate, including
forming a dielectric barrier on a wall of an opening in a material stack;
forming a dielectric blocking region on and contacting the dielectric barrier;
forming a charge trap region on and contacting the dielectric blocking region;
forming a tunnel region on and contacting the charge trap region;
forming a semiconductor pillar on and contacting the tunnel region, the semiconductor pillar separated from the charge trap region by the tunnel region, the semiconductor pillar operable to conduct a current;
forming a gate on and contacting the dielectric barrier, at least a portion of the gate separated from at least a portion of an adjacent gate by at least a void, the gate separated from the dielectric blocking region by the dielectric barrier, the gate operable to control storage of charge in the charge trap region, wherein the dielectric barrier is vertically contacting the gate, the gate of the adjacent charge trap structure, and extends from the gate to the gate of the adjacent charge trap structure, with the dielectric barrier constructed to form at least a portion of a boundary of the void.

17. The method of claim 16, wherein the method includes:
forming the opening in the material stack with the material stack having alternating sacrificial regions and isolation dielectrics;
removing sacrificial regions adjacent to the dielectric barrier using a chemistry and process to remove the sacrificial region substantially without removing material for the dielectric barrier;
forming the gate in a region in which a sacrificial region has been removed and forming the adjacent gate in a region in which another one of the sacrificial regions has been removed;
removing material from between the gate and the adjacent gate to form an open area by a chemistry and process to remove the isolation dielectrics previously formed between adjacent sacrificial regions without substantially removing the material for the dielectric barriers, without substantially removing material of the gate, and without substantially removing material of the adjacent gate; and
forming a dielectric in at least a portion of the open area to form the void.

18. The method of claim 16, wherein forming the dielectric barrier includes forming aluminum.

19. The method of claim 16, wherein forming the dielectric barrier includes forming a dielectric material having a dielectric constant greater than that of aluminum oxide.

20. The method of claim 16, wherein forming the charge trap region includes forming a dielectric nitride as the charge trap region.

21. The method of claim 16, wherein forming the gate includes forming tungsten as a portion part of the gate.

22. The method of claim 21, wherein forming the gate includes forming a titanium nitride region on and contacting the dielectric barrier and forming the tungsten on the titanium nitride region.

* * * * *